(12) United States Patent
Harada

(10) Patent No.: US 6,657,439 B1
(45) Date of Patent: Dec. 2, 2003

(54) SHEET RESISITANCE METER

(75) Inventor: Yoshinori Harada, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/560,614

(22) Filed: Apr. 26, 2000

(30) Foreign Application Priority Data

Apr. 28, 1999 (JP) .......................................... 11-122948

(51) Int. Cl.⁷ .............................................. G01R 27/00
(52) U.S. Cl. ...................... 324/600; 324/691; 324/693; 324/750
(58) Field of Search ................................ 324/715, 716, 324/719, 758, 691, 693, 750, 600, 238, 235, 225, 252; 361/234; 438/14; 279/128, 126; 29/900

(56) References Cited

U.S. PATENT DOCUMENTS

| | | | |
|---|---|---|---|
| 4,868,490 A | * | 9/1989 | Blumenthal |
| 5,377,071 A | * | 12/1994 | Moslehi |
| 5,461,358 A | * | 10/1995 | Ravas |
| 5,660,672 A | | 8/1997 | Li et al. |
| 5,914,611 A | * | 6/1999 | Cheng |
| 5,970,313 A | * | 10/1999 | Rowland |
| 6,150,809 A | * | 11/2000 | Tiernan ...................... 324/238 |

FOREIGN PATENT DOCUMENTS

| | | |
|---|---|---|
| JP | 56-048145 | 5/1981 |
| JP | 05-21382 | 1/1993 |
| JP | 06-69310 | 3/1994 |

* cited by examiner

*Primary Examiner*—Kamand Cuneo
*Assistant Examiner*—Trung Nguyen
(74) *Attorney, Agent, or Firm*—David G. Conlin; William J. Daley, Jr.; Edwards & Angell, LLP

(57) ABSTRACT

A sheet resistance meter includes a sensor head for generating a magnetic field; and an amplifier for, when a semiconductor wafer, an object to be measured, is placed at a predetermined distance from the sensor head, detecting a variation in the magnetic field generated by the sensor head as the sheet resistance of a thin film formed on the semiconductor substrate, wherein the sensor head is disposed opposing only one of two sides of the semiconductor wafer. In this manner, a sheet resistance meter is offered that can be readily accommodated into an existent manufacturing line so as to enable in-line measurement of the sheet resistance of a thin film and suitable control of the properties of a thin film.

25 Claims, 29 Drawing Sheets

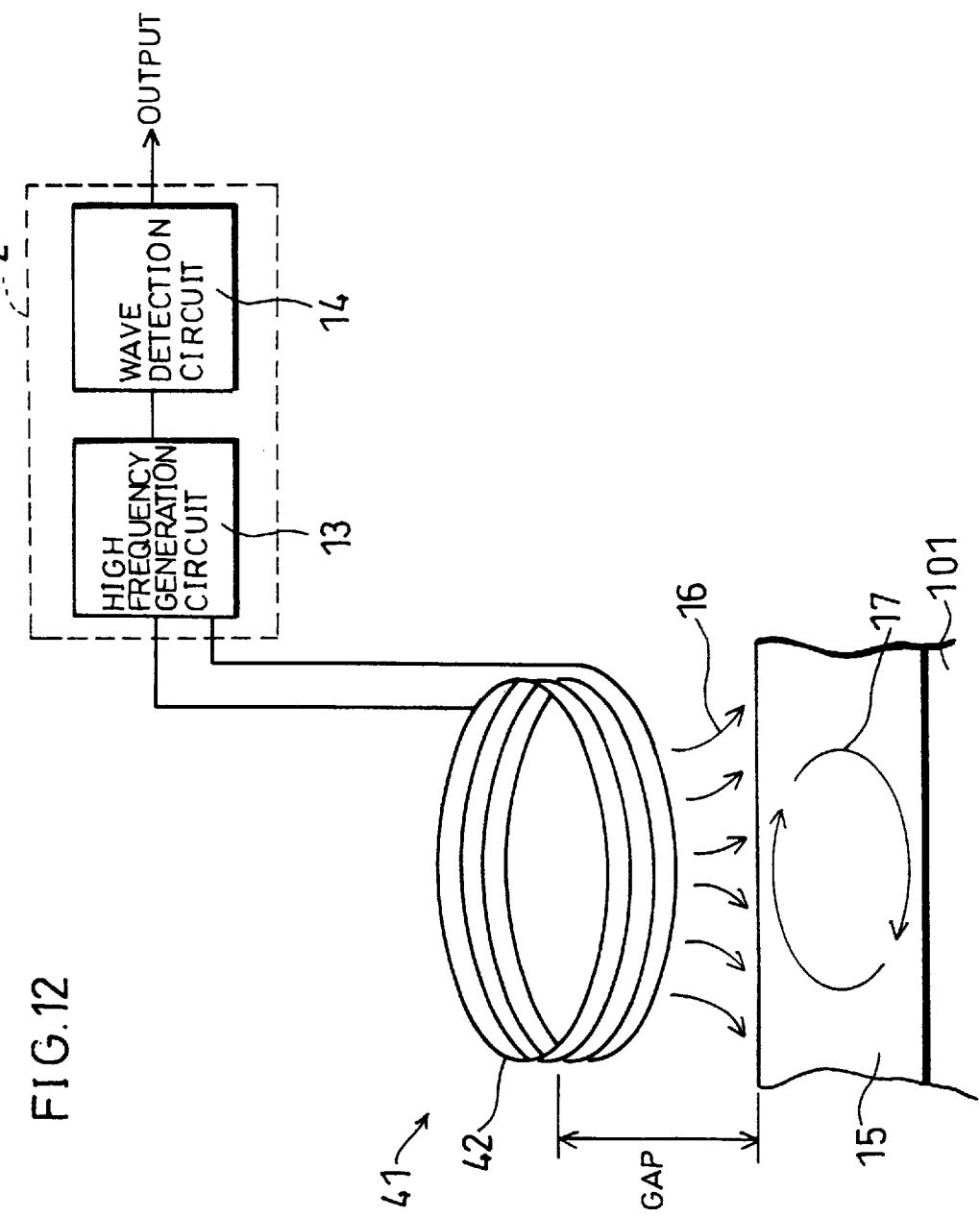

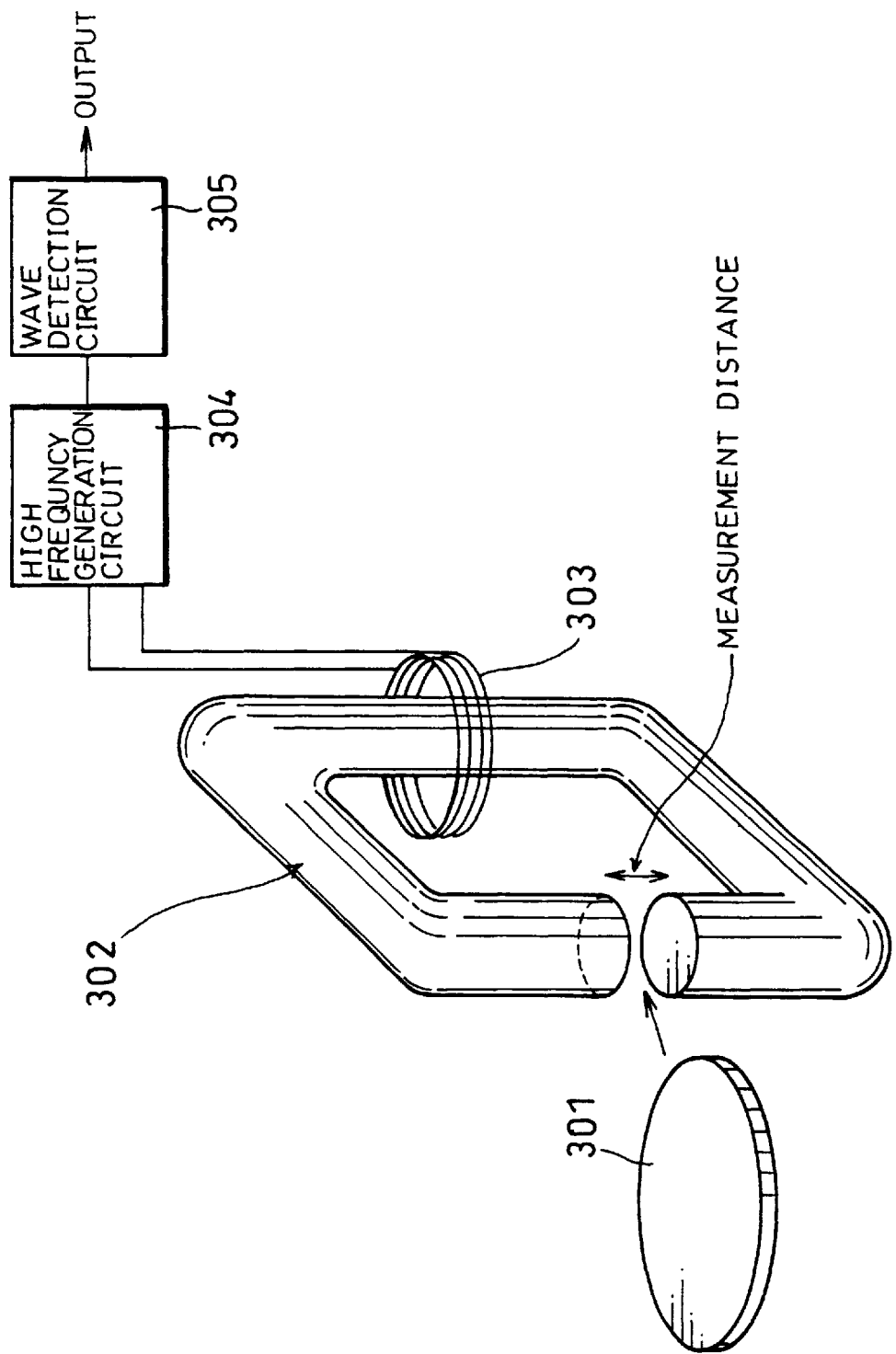

SHEET RESISTANCE METER

FIELD OF THE INVENTION

The present invention relates to a sheet resistance meter for measuring a sheet resistance of a thin-film metal or alloy formed on a substrate, for example, a semiconductor wafer, with a sputtering or vapor deposition technique.

BACKGROUND OF THE INVENTION

Conventionally, film properties, such as thickness, composition, and size, of a thin-film metal or alloy formed on a glass substrate by a sputtering or vapor deposition technique (hereinafter, will be referred to simply as a thin-film metal) are evaluated by means of measurement of a sheet resistance of the thin-film metal. That is, the properties of a thin-film metal formed on a glass substrate are evaluated according to whether or not the sheet resistance measured falls within a predetermined range or stays below a reference value.

For this purpose, the sheet resistance may be measured, for example, through a sensor section directly contacting the thin-film metal (contact-type sheet resistance measurement technique). An example of the contact-type sheet resistance measurement technique is a four-probe scheme.

The following description will explain the evaluation of properties of a thin-film metal by a four-probe scheme in reference to FIG. 28. Note that in the four-probe scheme, the sheet resistance is not directly measured for evaluation of the properties the thin-film metal. Instead, the resistivity of the thin-film metal is measured, and the sheet resistance is obtained based on the resistivity.

First, four needle-like electrodes (probes) 203, arranged in a straight line, are placed on a thin-film metal 202 formed on a substrate 201, and a current I is applied to the two outer probes 203 to measure the potential difference V developing between the two inner probes 203 and eventually obtain the resistance (R=V/I).

Subsequently, the obtained resistance R is multiplied by the thickness t of the thin-film metal 202 and a dimensionless correction factor F determined from the shape and dimensions of the thin-film metal 202 as well as from the position of the probes 203, so as to obtain the resistivity ρ of the thin-film metal 202. The sheet resistance is obtained based on the resistivity ρ.

In the four-probe scheme, the probes 203 are brought into contact with the thin-film metal 202 to measure the resistivity ρ; the thin-film metal 202 may be scratched and cause fine dust, and the probes 203 may wear out and need be changed regularly.

Further, measurement cannot be performed if the object, i.e., the thin-film metal 202 on the substrate 201, is shaking. Therefore, a dedicated attach stage needs be provided on which the substrate 201 is firmly attached. The resistivity measuring device containing such a dedicated attach stage would be inevitably bulky; therefore its accommodation in an existent manufacturing line of the thin-film metal 202 on the substrate 201 is difficult, let alone in-line measurement of the resistivity ρ of the thin-film metal 202.

Another method suggested to evaluate properties of a thin-film metal is a non-contact method (non-contact-type sheet resistance measurement technique) whereby the sheet resistance of a thin-film metal is measured through metal needles or the like that do not contact the thin-film metal.

According to the non-contact-type sheet resistance measurement technique, the sheet resistance of the thin-film metal is measured by means of the eddy currents that are induced in the thin-film metal by application of high frequency electric power and lost as Joule heat.

In other words, the non-contact-type sheet resistance measurement technique makes use of the positive correlation between the conductivity and the dissipation of high frequency electric power in a thin-film metal, so as to obtain the conductivity (the reciprocal of resistivity) of a thin-film metal on a semiconductor wafer in a non-contact manner. Note that in the non-contact-type sheet resistance measurement technique, the sheet resistance of the thin-film metal is not directly measured for evaluation of the properties of the thin-film metal. Instead, the conductivity of the thin-film metal is measured, and the sheet resistance is obtained based on the conductivity.

Specifically, as shown in FIG. 29, a semiconductor wafer 301 on which a thin-film metal is formed is placed in the gap (measurement distance: 1 to 2 mm) of a ferrite core 302 around which a coil 303 connected to a high frequency generation circuit 304 is wound. Eddy currents are induced in a thin-film metal on the semiconductor wafer 301. The induced eddy currents are lost as Joule heat, and therefore the high frequency electric power is dissipated in the thin-film metal on the semiconductor wafer 301.

Hence, the high frequency electric power dissipated in the thin-film metal on the semiconductor wafer 301 is detectable as eddy current loss. The eddy current loss is transferred from the coil 303 via the high frequency generation circuit 304 to the wave detection circuit 305 and supplied as a difference in the output voltage. Then, the control circuit (not shown) obtains the conductivity of the thin-film metal on the semiconductor wafer 301 based on the output voltage from the wave detection circuit 305. Then the sheet resistance is obtained from the conductivity.

In the non-contact-type sheet resistance measurement technique, there is no sensor section directly in contact with the object, i.e., the thin-film metal: therefore, unlike in the contact-type sheet resistance measurement technique, the thin-film metal is not scratched nor does not cause fine dust, and no probes are involved that may wear out and need be changed regularly.

Incidentally, in view of control of product quality of semiconductor wafers and other glass substrates on which a thin-film metal is formed, it is preferable to measure the sheet resistance for every semiconductor wafer, etc. manufactured. To realize this, the sheet resistance should be measured for every semiconductor wafer in-line, i.e., without the semiconductor wafer leaving the manufacturing line.

In the foregoing non-contact-type sheet resistance measurement technique, as shown in FIG. 29, the ferrite core 302 is shaped so as to clamp the semiconductor wafer 301 to induce eddy currents in the thin-film metal on the semiconductor wafer 301.

Therefore, the structure of the ferrite core 302 shown in FIG. 29 renders it difficult to measure the sheet resistance on an existent manufacturing line; in order to measure the sheet resistance of the thin-film metal on a semiconductor wafer, the semiconductor wafer needs be removed from the manufacturing line to measure the sheet resistance at a different place.

Therefore, it is time-consuming to measure the sheet resistance of every semiconductor wafer, and doing so would reduce operational efficiency. For these reasons, in actual practice, one of every predetermined number of semiconductor wafers is selected for measurement of the sheet resistance, which is regarded as being equivalent in effect to the measurement of the sheet resistance of every semiconductor wafer. This holds true with the foregoing four-probe scheme.

If some semiconductor wafers are removed from the manufacturing line for measurement of the sheet resistance, and the result of the measurement shows that the sheet resistance is not normal, all the semiconductor wafers including that semiconductor wafer back to the semiconductor wafer removed last time for the measurement of the sheet resistance must be checked to see whether the sheet resistance is normal or not.

In addition, to avoid further occurrence of abnormal sheet resistance and thereby bring the sheet resistance back to a normal value, the manufacturing line must be stopped to notify a CIM process management system and a thin film forming device of the abnormal value.

Therefore, in the foregoing four-probe scheme and non-contact-type sheet resistance measurement technique, no quick action can be taken when an abnormality occurs to the sheet resistance of the semiconductor wafer in the manufacturing line. As a result, a proper management of the properties of the thin-film metal on the semiconductor wafer is impossible.

Besides, if the semiconductor wafer is constituted by a large glass substrate, a large machine is necessary to remove a semiconductor wafer from the manufacturing line and to transport the semiconductor wafer to a place where the sheet resistance is measured. This reduces operational efficiency and possibly damaging the semiconductor wafer.

These problems may be possibly solved by measuring the sheet resistance of the thin-film metal without removing the semiconductor wafer from the manufacturing line. However, the sheet resistance meter used in the foregoing non-contact-type sheet resistance measurement technique by means of eddy currents cannot be incorporated in an existent manufacturing line without modification. The sheet resistance meter can be incorporated in-line only by redesigning the manufacturing line. In such an event, the existent manufacturing line cannot be used, which adds to cost.

SUMMARY OF THE INVENTION

The present invention has an object to offer a sheet resistance meter that is readily accommodated into an existent manufacturing line so as to enable in-line measurement of the sheet resistance of a thin film and suitable control of the properties of high-resistance ITO and other thin films.

A sheet resistance meter in accordance with the present invention is a sheet resistance meter for measuring a sheet resistance of a thin film formed on a substrate, and is characterized in that it includes:

a sensor head for generating a magnetic field; and sheet resistance detection means for, when the substrate is placed at a predetermined distance from the sensor head, detecting a variation in the magnetic field generated by the sensor head as the sheet resistance of the thin film formed on the substrate, wherein the sensor head is disposed opposing only one of two sides of the substrate.

With the arrangement, the sensor head is disposed opposing only one of two sides of the substrate; therefore, the sheet resistance of the thin film formed on the substrate can be measured on either the top side or the bottom side, while, for example, the substrate, i.e., an object to be measured, is in the manufacturing line.

This enables the sheet resistance of the thin film formed on the substrate to be measured in a manufacturing line, and thereby, unlike conventional technology, eliminate the need to remove the substrate from the manufacturing line to measure the sheet resistance. Accordingly, the sensor head can be incorporated into an existent manufacturing process or manufacturing machine, facilitating its in-line integration.

Further, the sensor head and the substrate are placed at a predetermined distance from each other when the sheet resistance of the thin film on the substrate is measured; therefore, the sensor head can measure the sheet resistance of the thin film without contacting the thin film on the substrate.

As a result, the sheet resistance of the thin film can be measured without the sensor head scratching or damaging the substrate or the thin film formed on the substrate.

Accordingly, the sheet resistance of the thin film can be measured without the sensor head scratching the substrate or the thin film formed on the substrate.

For a fuller understanding of the nature and advantages of the invention, reference should be made to the ensuing detailed description taken in conjunction with the accompanying drawings.

BRIEF DESCRIPTION OF THE DRAWINGS

FIG. 12 is an explanatory view showing principle in sheet resistance measurement using a sheet resistance meter of a further embodiment in accordance with the present invention.

FIG. 13(*b*) is a perspective view partially showing a cross-section of the coil section shown in FIG. 13(*a*).

FIG. 29 is an explanatory view showing principle in sheet resistance measurement according to a double-side eddy current method.

DESCRIPTION OF THE EMBODIMENTS

Referring to FIG. 1 to FIG. 5, the following description will discuss an embodiment in accordance with the present invention.

A sheet resistance meter of the present embodiment measures the sheet resistance of a thin-film metal or alloy (hereinafter, will be referred to as a thin-film metal) formed on a substrate surface by sputtering or vacuum vapor deposition. Here, the description will focus on the measurement of the sheet resistance of a thin-film metal formed on a semiconductor wafer outside a load-lock chamber.

Figure 1:
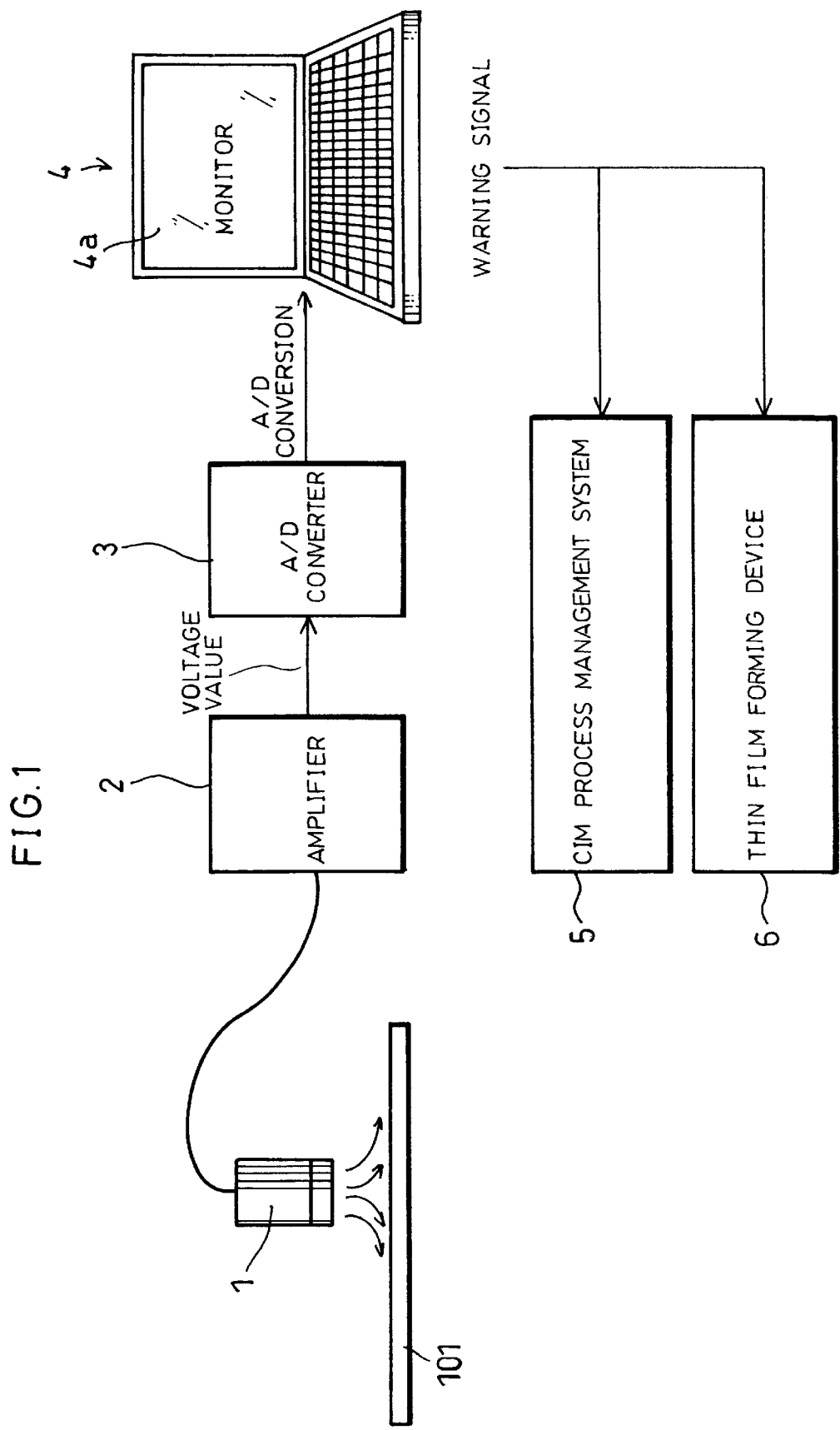
FIG. 1 is a schematic drawing showing a configuration of a sheet resistance measurement system including a sheet resistance meter of an embodiment in accordance with the present invention.

As shown in FIG. 1, the sheet resistance meter includes a sensor head 1 and an amplifier (sheet resistance detection means) 2. The sensor head 1 is disposed opposing a semiconductor wafer 101 on a side thereof on which a thin-film metal is formed. The amplifier 2 is for supplying high frequency electric power to the sensor head 1 and for amplifying an incoming detection signal from the sensor head 1 for output.

The sensor head 1 generates a magnetic field (represented by arrows in FIG. 1) toward the semiconductor wafer 101, and the magnetic field induces eddy currents in the thin-film metal of the semiconductor wafer 101. A variation in the magnetic field is supplied to the amplifier 2. The structure of the sensor head 1 will be described later in detail.

The sheet resistance meter is arranged so as to detect variations in the magnetic field generated by the sensor head 1 as the eddy current loss by the amplifier 2, when the semiconductor wafer 101 is placed at a predetermined distance from the sensor head 1. Note that the sensor head 1 is disposed opposing only one of the sides of the semiconductor wafer 101.

The sensor head 1, disposed opposing only one of the sides of the semiconductor wafer 101 as in the foregoing, enables the sheet resistance meter of the present embodiment to measure the sheet resistance of the thin-film metal formed on the semiconductor wafer 101 either on the upper or lower side of the semiconductor wafer 101 without removing the semiconductor wafer 101 from the manufacturing line.

In short, the sheet resistance meter can measure the sheet resistance of the thin-film metal formed on the semiconductor wafer 101 in the manufacturing line (in-line). Therefore, unlike conventional measurement techniques, the substrate does not need to be removed from the manufacturing line to measure the sheet resistance.

Thus, the sensor head 1 can be readily incorporated in an existent manufacturing process or machine, and facilitates realization of in-line measurement.

In addition, since the sensor head 1 is placed at a predetermined distance from the semiconductor wafer 101, the sensor head 1 does not contact the thin film on the semiconductor wafer 101 during the measurement of the sheet resistance of the thin film on the semiconductor wafer 101.

Therefore, the sensor head 1 does not scratch the semiconductor wafer 101 or the thin film on the semiconductor wafer 101 during the measurement of the sheet resistance of the thin film on the semiconductor wafer 101.

The configuration of the foregoing sheet resistance meter of the present embodiment will be explained in detail in the following in reference to FIG. 1.

The amplifier 2 constituting the sheet resistance meter amplifies an incoming detection signal from the sensor head 1 using an operational amplifier, translates the amplified signal to an equivalent d.c. voltage effective value, and supplies the translated d.c. voltage value to an A-to-D converter 3.

The A-to-D converter 3 converts the incoming voltage value (analog signal) from the amplifier 2 to a digital signal, and supplies the digital signal (A-to-D converted value) to the controller 4.

The controller 4 calculates, and stores, the sheet resistance value of the thin-film metal formed on the surface of the semiconductor wafer 101 based on the incoming digital signal from the A-to-D converter 3.

If the calculated sheet resistance value does not fall within a predetermined range, the controller 4 determines that the sheet resistance of the thin-film metal on the surface of the semiconductor wafer 101 currently being tested on has an abnormal value, and transmits a signal representative of the abnormality in the sheet resistance value to a CIM process management system 5 and also to a thin film forming device 6 for forming the thin-film metal on the surface of the semiconductor wafer 101.

The CIM process management system 5 controls the entire manufacture of semiconductor devices, including the manufacturing process of the semiconductor wafer 101. Accordingly, if the sheet resistance of the thin-film metal on the semiconductor wafer 101 is abnormal, the CIM process management system 5 takes actions, including causing some sections of the manufacturing line to stop operation as necessary so as to avoid further production of semiconductor wafers 101 with abnormal sheet resistance.

The thin film forming device 6 is for fabricating a thin film in metal on a glass substrate as a base material constituting the semiconductor wafer 101 by sputtering or vapor deposition. Accordingly, if the sheet resistance of the thin-film metal on the semiconductor wafer 101 is abnormal, the thin film forming device 6 stops formation of the thin-film metal immediately.

As explained in the foregoing, when the sheet resistance of the thin-film metal on the semiconductor wafer 101 has an abnormal value, the controller 4 immediately transmits a warning signal to the CIM process management system 5 and the thin film forming device 6; therefore, the semiconductor wafer 101 is manufactured with an irregular thin-film metal in a least possible quantity.

The controller 4 includes a monitor 4a for a display of the sheet resistance value of the thin-film metal formed on the surface of the semiconductor wafer 101. This enables a person in charge to find an abnormality in the sheet resistance of the thin-film metal formed on the semiconductor wafer 101 simply by watching the display on the monitor 4a included in the controller 4.

Accordingly, if a person in charge finds an abnormality in the sheet resistance through the display on the monitor 4a included in the controller 4, he/she can reduce the number of semiconductor wafers 101 manufactured with an irregular thin-film metal to a least possible quantity, provided that he/she operates the CIM process management system 5 and the thin film forming device 6 immediately so as to restore the sheet resistance of the thin-film metal formed on the semiconductor wafer 101 to a normal range.

The monitor 4a included in the controller 4 displays various kinds of information on the thin-film metal, including changes in coil temperature, which will be discussed later. This allows the person in charge to control properties of the thin-film metal formed on the semiconductor wafer 101 through effecting various settings while watching the information on the monitor 4a of the controller 4.

Now, the principle in detection of the sheet resistance value using the sheet resistance meter will be explained in the following in reference to FIG. 2.

Figure 2:
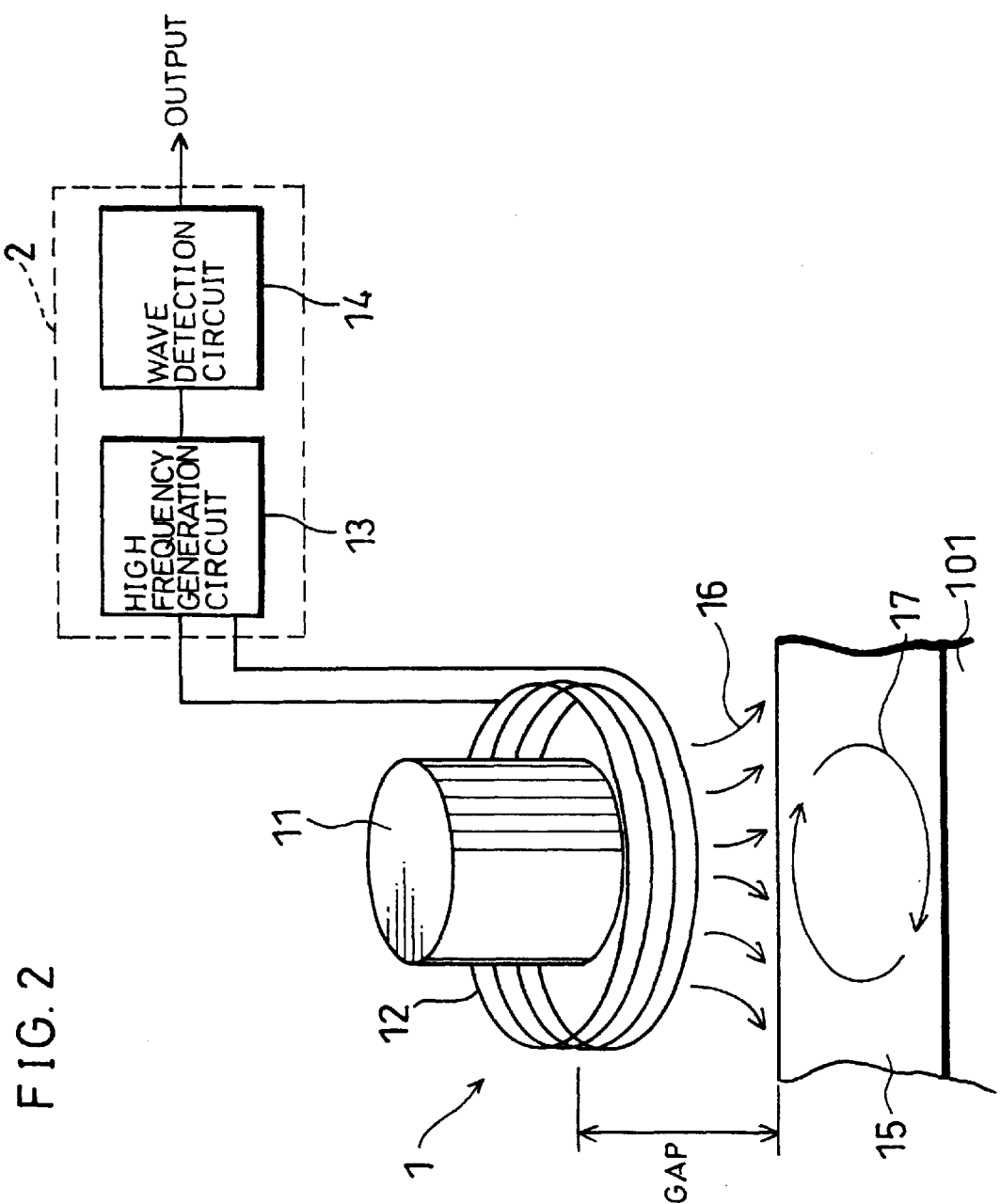
FIG. 2 is a schematic explanatory view showing a configuration of the sheet resistance meter in the sheet resistance measurement system shown in FIG. 1.

The sensor head 1 is constituted, as shown in FIG. 2, by a column-shaped ferrite core 11 and a coil 12 wound around the ferrite core 11.

The amplifier 2 is constituted by a high frequency generation circuit 13 connected to the coil 12, and a wave detection circuit 14 for separating a necessary signal wave (voltage value) from an incoming modulated wave from the high frequency generation circuit 13.

Upon reception of high frequency electric power supplied by the high frequency generation circuit 13, the coil 12 generates magnetic lines of force 16 extending toward a thin-film metal 15 on the surface of the semiconductor wafer 101 and thereby generates eddy currents 17 in the thin-film metal 15. The eddy currents 17 generated in the thin-film metal 15 are lost as Joule heat, causing the high frequency electric power supplied to the high frequency generation circuit 13 via the coil 12 to change.

In other words, in the high frequency generation circuit 13, the high frequency electric power supplied to the coil 12 differs from the high frequency electric power returning from the coil 12, because the eddy currents 17 are generated in the thin-film metal 15. The magnitude of the eddy currents 17 is determined by the size of the sensor head 1, the composition of the thin-film metal 15, i.e., an object to be measured for the sheet resistance, and the distance between the sensor head 1 and the thin-film metal 15. The high frequency electric power varies in relation with the magnitude of the eddy currents 17.

The high frequency generation circuit 13 transmits the change in the high frequency electric power in the form of a modulated wave to the wave detection circuit 14 where the signal wave is separated from the modulated wave. The signal wave is then translated to a voltage value, and supplied to the A-to-D converter 3 as shown in FIG. 1.

In the sheet resistance meter configured as in the foregoing, as shown in FIG. 1 and FIG. 2, the sensor head 1 is placed at a predetermined distance from the thin-film metal 15 formed on the surface of the semiconductor wafer 101 on either side of the semiconductor wafer 101 (in FIG. 1 and FIG. 2, on the side where the thin-film metal 15 is formed). The sheet resistance value of the thin-film metal 15 is measured under this condition, i.e., the sensor head 1 does not contact the thin-film metal 15.

Accordingly, the sheet resistance value of the thin-film metal 15 on the semiconductor wafer 101 can be measured in-line with the sensor head 1 being fixed to a transport stage of the semiconductor wafer 101

This eliminates the need to remove the semiconductor wafer 101 from the manufacturing line to measure the sheet resistance of the thin-film metal on the semiconductor wafer 101 at a separate place.

Accordingly, every semiconductor wafer 101 takes reduced time to measure the sheet resistance, which will contribute to the improvement of operational efficiency.

In addition, every semiconductor wafer 101 moving along the manufacturing line is measured for the sheet resistance of the thin-film metal. Therefore, yields of tested semiconductor wafers 101 are improved in comparison to conventional measurement of the sheet resistance of only one of every predetermined number of semiconductor wafers 101 for the improvement of operational efficiency.

The measurement of the sheet resistance of the thin-film metal on the semiconductor wafer 101 can be executed in-line as described in the foregoing; therefore, if the sheet resistance value measured is determined to be abnormal, the CIM process management system 5 and the thin film forming device 6 are notified immediately of the abnormality, which enables quick and proper management of the film properties of the thin-film metal on the semiconductor wafer 101.

Further, the in-line measurement of the sheet resistance of the thin-film metal can be executed on a semiconductor wafer 101 constituted by a large-size glass substrate, which prevents such a semiconductor wafer 101 from being damaged and the operational efficiency from falling as the semiconductor wafer 101 is removed and transported.

Further, an existent manufacturing line can be used to manufacture the semiconductor wafer 101, and there is no need to design a new manufacturing line to allow the measurement of the sheet resistance.

As discussed so far, the sheet resistance meter of the present embodiment measures the sheet resistance of the thin-film metal formed on the semiconductor wafer 101 by generating eddy currents in the thin-film metal. So, in the discussion hereinafter, the sheet resistance meter will be referred to as an eddy-current-type sheet resistance meter.

In the present embodiment, the foregoing eddy-current-type sheet resistance meter is a distance sensor for measuring the distance between the thin film and the sensor section. The following description will discuss under what conditions the distance sensor is used as an eddy-current-type sheet resistance meter in reference to FIG. 3 and FIG. 4.

The distance sensor is for measuring the distance between the sensor head and the thin film by means of a voltage value obtained when the distance is changed. Note that when the distance sensor is used as an eddy-current-type sheet resistance meter, thin films, i.e., objects to be tested, are limited only to Al, Ta, and other low-resistance metal thin films for detection sensitivity and other reasons.

Figure 3:
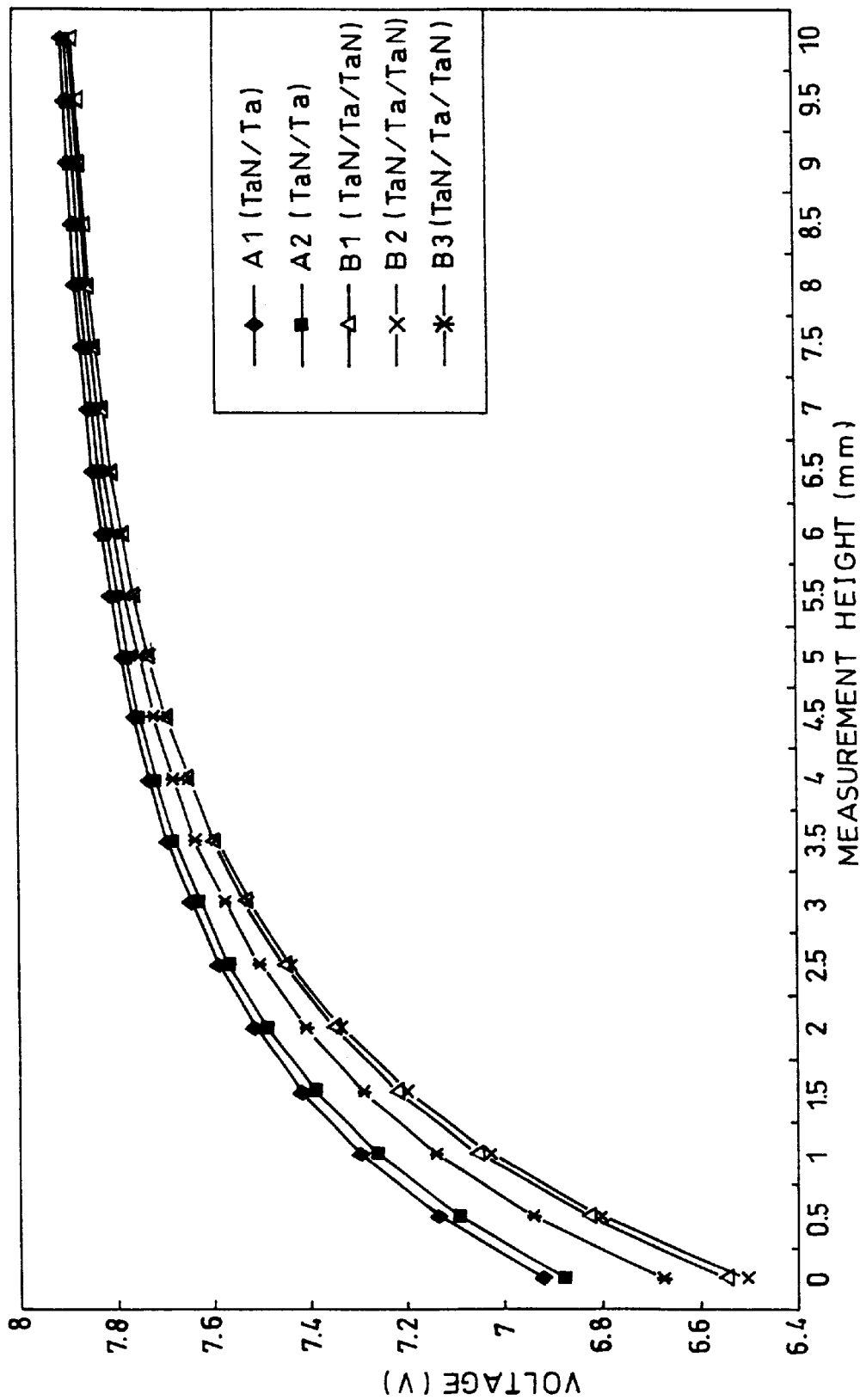
FIG. 3 is a graph showing correlation between detected output voltages and heights of a TaN/Ta multilayered thin film and a TaN/Ta/TaN multilayered thin film measured using the sheet resistance meter shown in FIG. 2.

The graph constituting FIG. 3 shows correlation between measurement heights (mm) and voltages (V) of TaN/Ta multilayered thin films and TaN/Ta/TaN multilayered thin films as the thin films.

In the graph, the samples A1 and A2 are TaN/Ta multilayered thin films, while the samples B1 to B3 are TaN/Ta/TaN multilayered thin films. The samples A1 and A2 share a common film thickness, but differ from each other in the sheet resistance value. Similarly, the samples B1 to B3 share a common film thickness, but differ from one another in the sheet resistance value. Table 1 below shows the sheet resistance values and film thicknesses of the samples A1, A2, and B1 to B3 used to obtain the graph.

TABLE 1

| Sample | Structure | Sheet Resistance ($\Omega/\square$) | Thickness (Å) |
|---|---|---|---|
| A1 | TaN/Ta | 1.163 | 2900(300/2600) |
| A2 | TaN/Ta | 1.148 | 2900(300/2600) |
| B1 | TaN/Ta/TaN | 0.8379 | 5100(700/2600/1800) |
| B2 | TaN/Ta/TaN | 0.8009 | 5100(700/2600/1800) |
| B3 | TaN/Ta/TaN | 0.9290 | 5100(700/2600/1800) |

The "measurement height" in the graph constituting FIG. 3 refers to a gap between the sensor head 1 and the thin-film metal 15 as shown in FIG. 2, for example. The "voltage" refers to the voltage detected by the sensor head 1 placed at a given measurement height. Accordingly, the eddy-current-type sheet resistance meter is designed so as to give the measurement height, i.e., the distance between the sensor head 1 to the thin-film metal 15, based on the voltage value obtained from the signal detected by the sensor head 1.

The graph constituting FIG. 3 shows that the voltage value is substantially linear to the measurement height when the measurement height is 2 mm or less. In other words, if eddy currents are generated in the object to be measured, i.e., the thin-film metal 15, while keeping the measurement height at 2 mm or less, the voltage value detected is directly proportional to the sheet resistance value.

Accordingly, when the foregoing distance sensor is incorporated in the eddy-current-type sheet resistance meter of the present embodiment, the gap between the sensor head 1 and the thin-film metal 15 is specified to 1.5 mm to measure the sheet resistance value of the TaN/Ta/TaN multilayered thin film formed on the surface of the semiconductor wafer 101. The voltage value detected by the sensor head 1 is plotted on the sheet-resistance-value-correction straight line shown in the graph constituting FIG. 4 to calculate the sheet resistance value of the thin-film metal 15.

Figure 4:
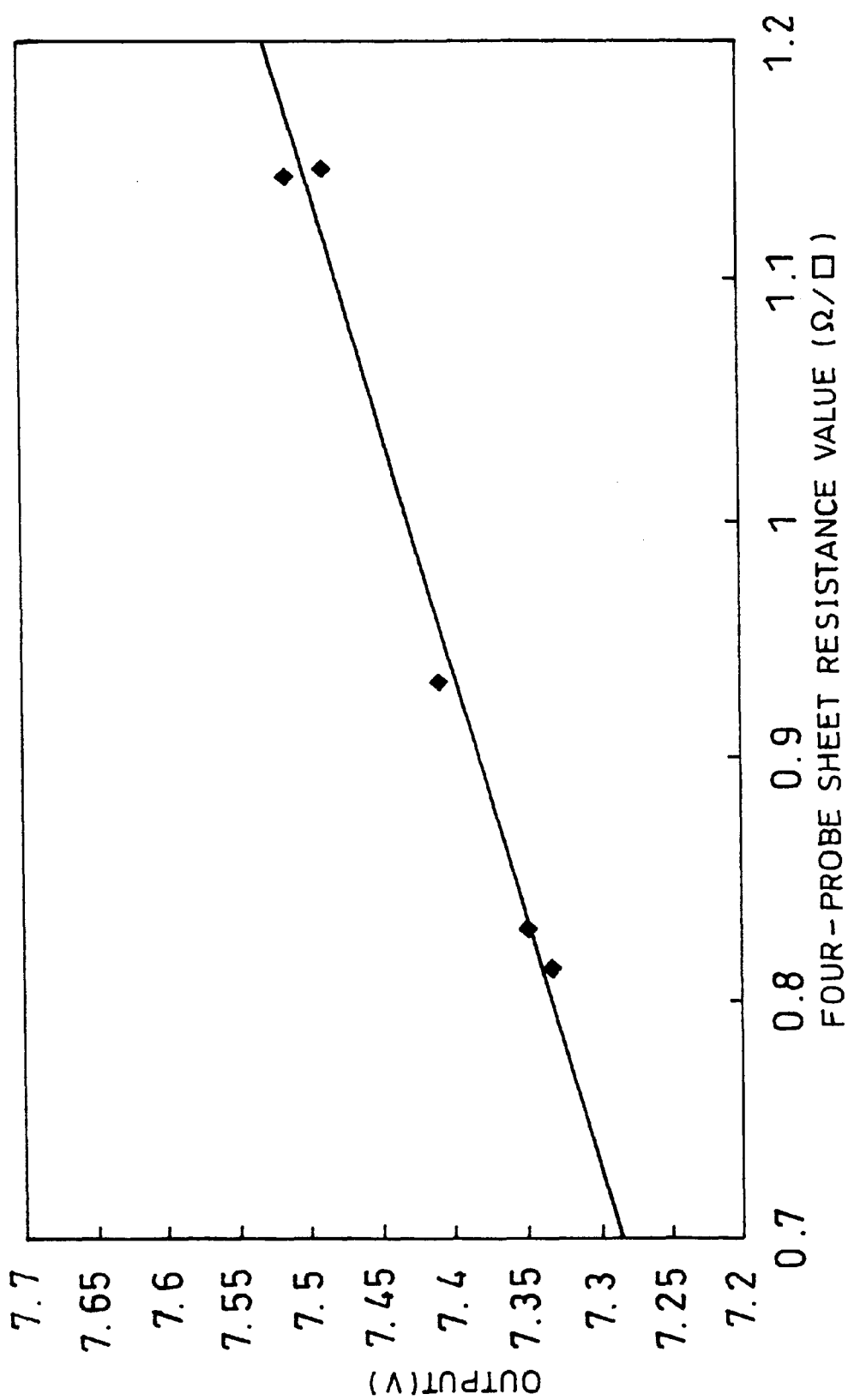
FIG. 4 is a graph showing a sheet-resistance-value-correction straight line used when the sheet resistance meter shown in FIG. 2 is distanced 2 mm from the thin film.

The sheet-resistance-value-correction straight line shown in the graph constituting FIG. 4 is drawn based on sheet resistance values (four-probe sheet resistance values ($\Omega/\square$)) obtained from measurement on the five kinds of thin-film metals shown in Table 1, i.e., the samples A1, A2, and B1 to B3, by a four-probe sheet resistance scheme and output voltages (V) obtained from measurement on the same five kinds of thin-film metals using the sensor head 1.

The sheet-resistance-value-correction straight line drawn in the graph is given by Y=0.4835X+6.948, where X represents the sheet resistance value and Y represents the output voltage measured using the sensor head 1. The precision in detection for the graph constituting FIG. 4 is ±1.19%.

Accordingly, the sheet resistance value X of the object to be measured, i.e., the thin-film metal 15, is obtainable by substituting the voltage obtained using the eddy-current-type sheet resistance meter configured as in the foregoing for Y in the equation expressing the sheet-resistance-value-correction straight line in the graph constituting FIG. 4.

Here, so that the sheet resistance value of the thin-film metal 15 falls in a predetermined range, upper and lower limits are specified in advance on the voltage obtained using the sensor head 1; and if the voltage either exceeds the upper limit or fails to reach the lower limit, that is, if the sheet resistance value is outside the predetermined range, an error signal (warning signal) is generated. The process is executed by the controller 4, the CIM process management system 5, and the thin film forming device 6 shown in FIG. 1.

Now, a brief explanation will be given about a process to be executed when the sheet resistance value of the thin-film metal 15 on the semiconductor wafer 101 is abnormal.

If the sheet resistance value is out of the predetermined range, the controller 4 supplies a warning signal to the CIM process management system 5 and the thin film forming device 6.

Upon receiving the warning signal, the CIM process management system 5 and the thin film forming device 6 control the film thickness of the thin-film metal 15, etc. so that the sheet resistance of the thin-film metal 15 formed on the semiconductor wafer 101 has a normal value, i.e., a desired value.

From the foregoing, the sensor head 1, if embedded as a part of the manufacturing line in a bottom surface of a transport stage (not shown) for the semiconductor wafer 101, can measure the sheet resistance value of the thin-film metal 15 without removing the semiconductor wafer 101 transported by the transport stage.

In such an event, when the sheet resistance of the thin-film metal 15 formed on the semiconductor wafer 101 has an abnormal value, that is, out of the predetermined range, the controller 4 can immediately send a warning signal to the CIM process management system 5 and the thin film forming device 6; therefore, troubles can be immediately solved, and film forming conditions are immediately altered, which improves the yield of the semiconductor wafer 101.

Incidentally, for example, if the sheet resistance of a thin-film metal 15 is out of the predetermined range, the semiconductor wafer 101 on which that thin-film metal 15 is formed needs to be removed from the manufacturing line of the semiconductor wafer 101. In such an event, typically, the semiconductor wafer 101 is removed from the manufacturing line using a robot hand or another tool.

However, to immediately remove from the manufacturing line the semiconductor wafer 101 whose sheet resistance value is determined to be irregular, the robot hand needs to move as close as possible to the semiconductor wafer 101. A solution is conceived where the sensor head 1 for detecting the sheet resistance is installed on the robot hand.

When the sensor head 1 is installed on a robot hand in this manner, the sensor head 1 needs to be embedded in the robot hand so that the robot hand does not obstruct the movement of the semiconductor wafer 101. Accordingly, the sensor head 1 needs to be thinner than the robot hand. For example, if the robot hand is 8 mm thick, the sensor head 1 needs to be not thicker than 8 mm.

Figure 5:
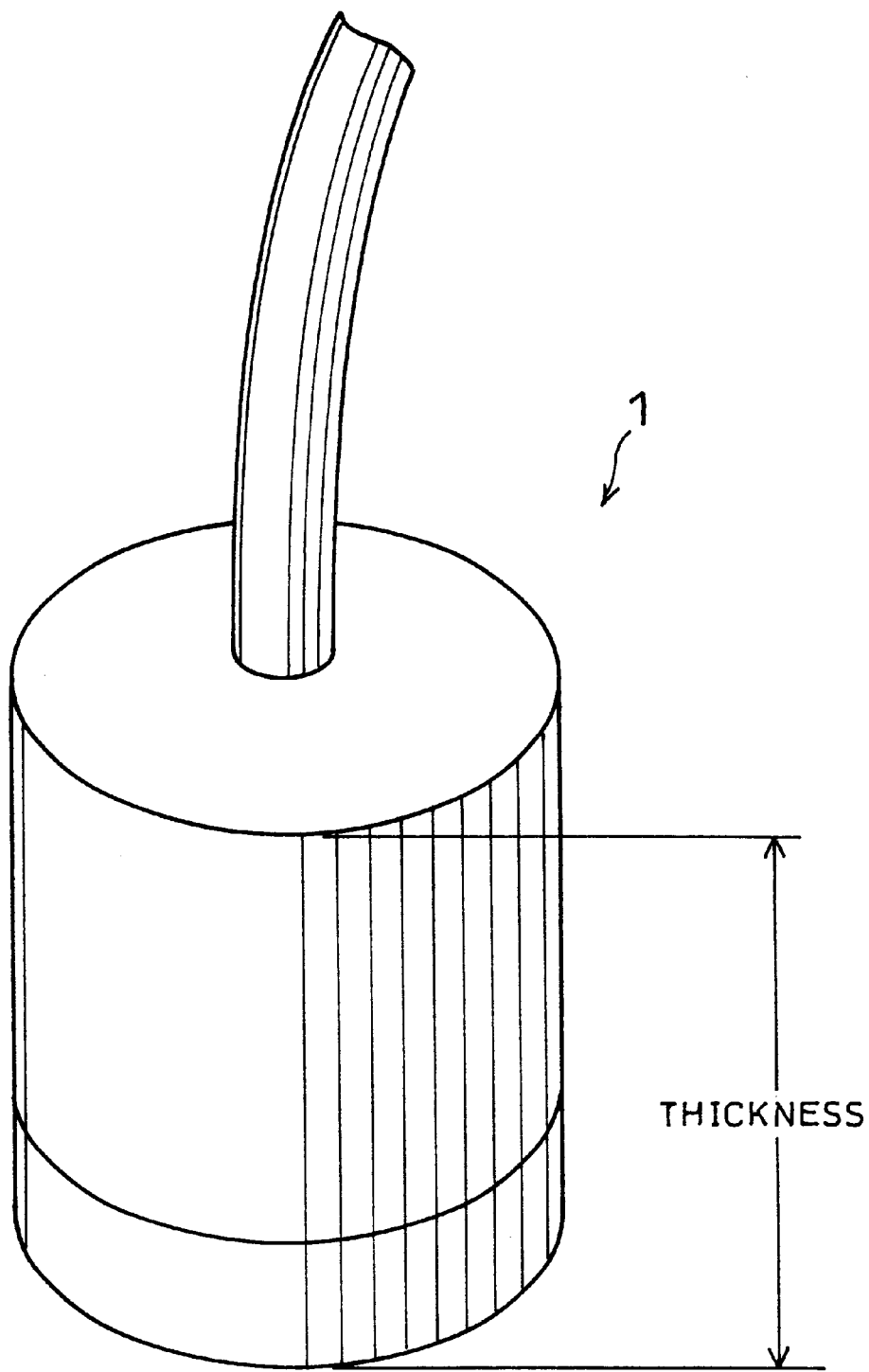
FIG. 5 is a perspective view showing a sensor head incorporated in the sheet resistance meter shown in FIG. 2.

However, as mentioned earlier, the eddy-current-type sheet resistance meter of the present embodiment includes a conventional distance sensor. The sensor head 1 is substantially column-shaped, and about 35 mm thick as shown in FIG. 5, which is too thick to be installed in a robot hand located in a conventional manufacturing line.

Accordingly, in the embodiment 2 below, a thin-type sensor head will be explained that can be embedded in the robot hand.

Embodiment 2

Figure 6:
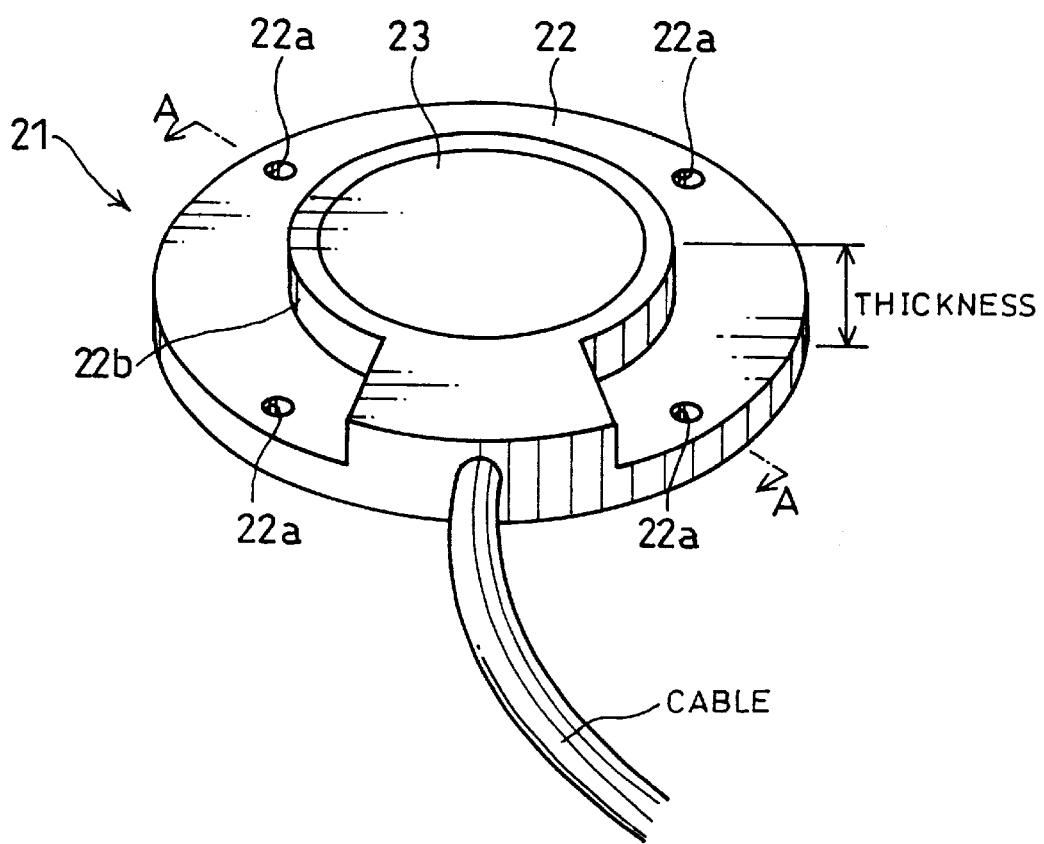
FIG. 6 is a perspective view showing a thin-type sensor head incorporated in a sheet resistance meter of another embodiment in accordance with the present invention.

Referring to FIG. 6 to FIG. 11, and FIG. 27, the following description will discuss another embodiment in accordance with the present invention. An eddy-current-type sheet resistance meter of the present embodiment includes a sensor head 21 that has a reduced thickness as shown in FIG. 6. Here, for convenience, members of the present embodiment that have the same arrangement and function as members of the previous embodiment, and that are mentioned in the previous embodiment are indicated by the same reference numerals and description thereof is omitted.

Figure 7:
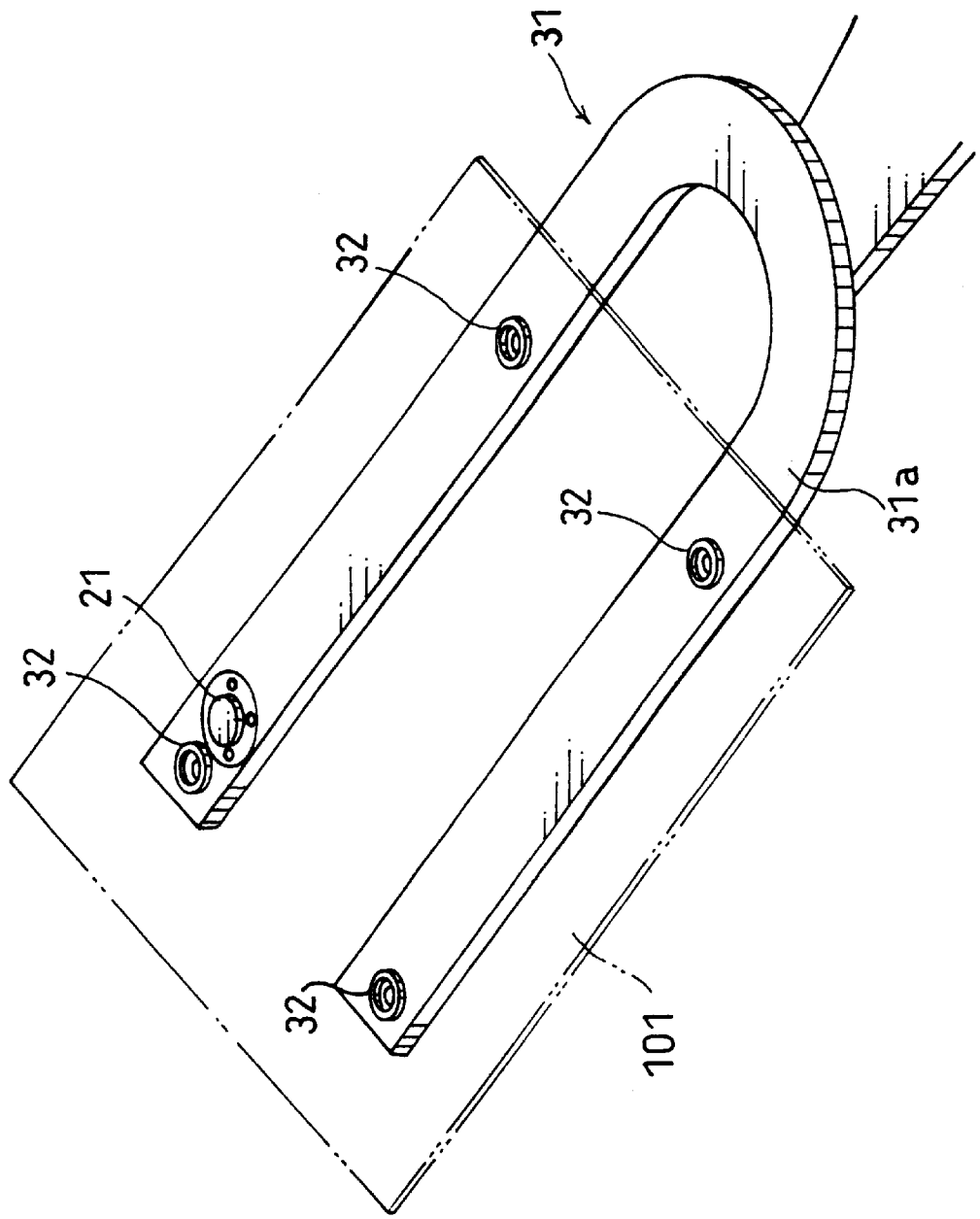
FIG. 7 is an explanatory view showing the sensor head shown in FIG. 6 mounted to a robot hand.

The sensor head 21 is embedded in a hand section 31a, a part of the robot hand 31, for holding the semiconductor wafer 101 as shown in FIG. 7.

The hand section 31a is substantially shaped in letter U, and includes four attractive pads 32 for attracting and holding the semiconductor wafer 101 onto the surface thereof. The attractive pads 32 may be provided in other numbers.

The sensor head 21 is for measuring the sheet resistance value without contacting the semiconductor wafer 101, and therefore, needs to be thinner than total thickness of the hand section 31a and the attractive pad 32 combined.

Further, when the semiconductor wafer 101 is attracted by and held onto the hand section 31a, the distance between the semiconductor wafer 101 and the hand section 31a is not affected in close proximity to the attractive pads 32 by a distortion including warping of the semiconductor wafer 101. Accordingly, the sensor head 21 is preferably disposed in close proximity to the attractive pads 32 on the hand section 31a.

Now, the structure of the sensor head 21 will be explained in detail below.

The sensor head 21 has a thin-type, substantially column-shaped, sensor cover 22 for covering each sensor section as shown in FIG. 6.

Figure 8:
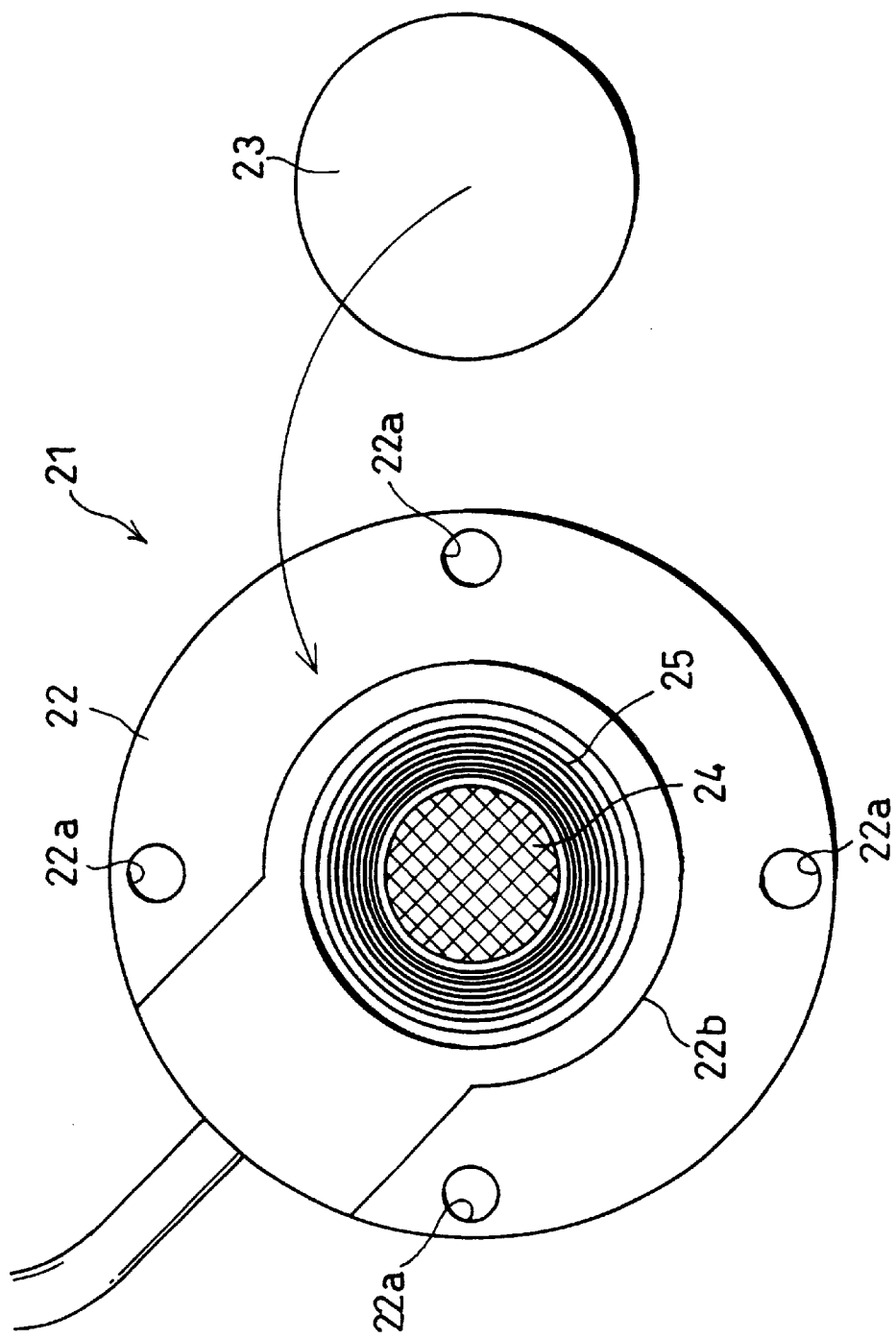
FIG. 8 is an explanatory view showing a cover lid of the sensor head shown in FIG. 6 being removed.

As shown in FIG. 8, a plurality of through holes 22a in which securing members, such as screws, are located are formed along the circumference of the sensor cover 22. This allows the sensor head 21, when embedded in the robot hand 31, to be secured onto the robot hand 31 by screws, etc. located in the through holes 22a formed on the sensor cover 22. The securing of the sensor head 21 onto the robot hand 31 will be described later in detail.

Further, a substantially cylindrical sensor container 22b is formed in the center of the sensor cover 22. A ferrite core 24 and a coil 25 as the sensor section are kept in the sensor container 22b as shown in FIG. 8. A cover lid 23 for covering the ferrite core 24 and the coil 25 is disposed on the sensor container 22b in such a manner to be freely attachable and detachable.

The coil 25 is constituted by a conducting wire wound around the ferrite core 24, and forms a part of the sensor section. The number of turns of the conducting wire in the coil, the cross-sectional diameter of the conducting wire, the shape of the coil, etc. are specified as appropriate depending on the kinds of the thin-film metal 15 to be measured.

In the present embodiment, the sensor head 21 is designed so as to be embedded in the about 8 mm-thick robot hand 31 used in a manufacturing line.

More specifically, the coil 25 is specified 30 mm in outer diameter, 26 mm in inner diameter, and 5 mm in thickness, and to have an inductance 0.9 mH. The ferrite core 24 is specified 24 mm in outer diameter and 5 mm in thickness. This means that the sensor head 21 of the present embodiment is designed about 7 mm in thickness with the thickness of the sensor cover 22 and other factors being considered.

Accordingly, the sensor head 21, formed as in the foregoing, can be embedded in the 8 mm-thick robot hand 31. The thickness of this sensor head 21 is about one-fifth that of the sensor head 1 explained earlier in the first embodiment in reference to FIG. 5.

Figure 9:
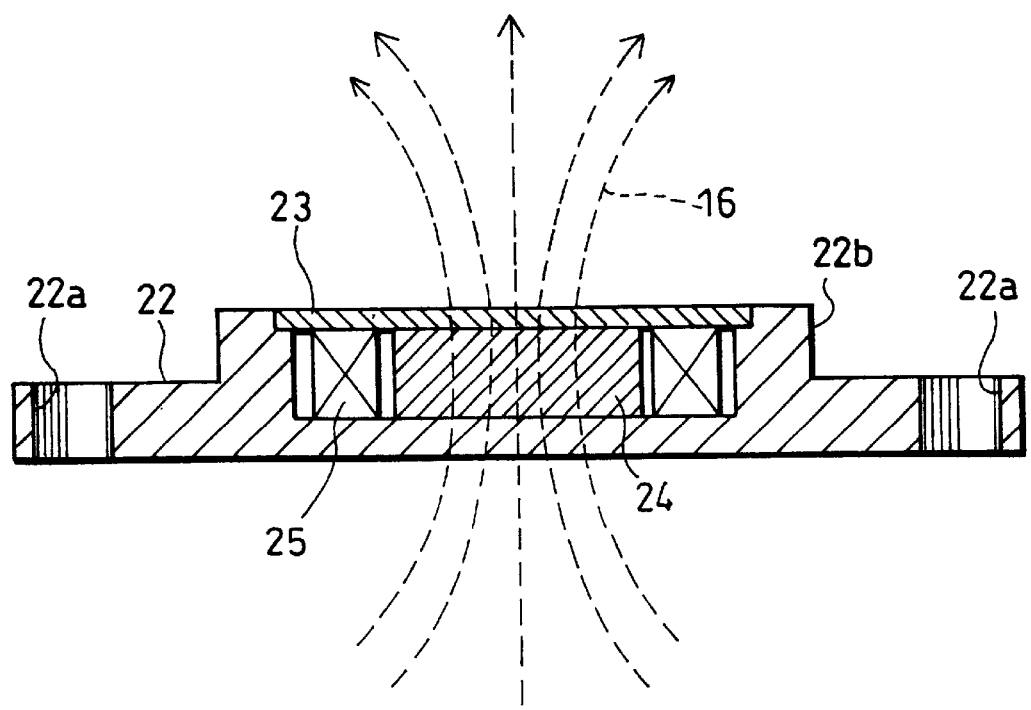
FIG. 9 is a cross-sectional view showing the sensor head shown in FIG. 6 taken along line A—A.

The sensor head 21 generates magnetic lines of force 16 travelling through the cover lid 23 placed on the sensor container 22b of the sensor cover 22 as shown in FIG. 9.

Figure 10:
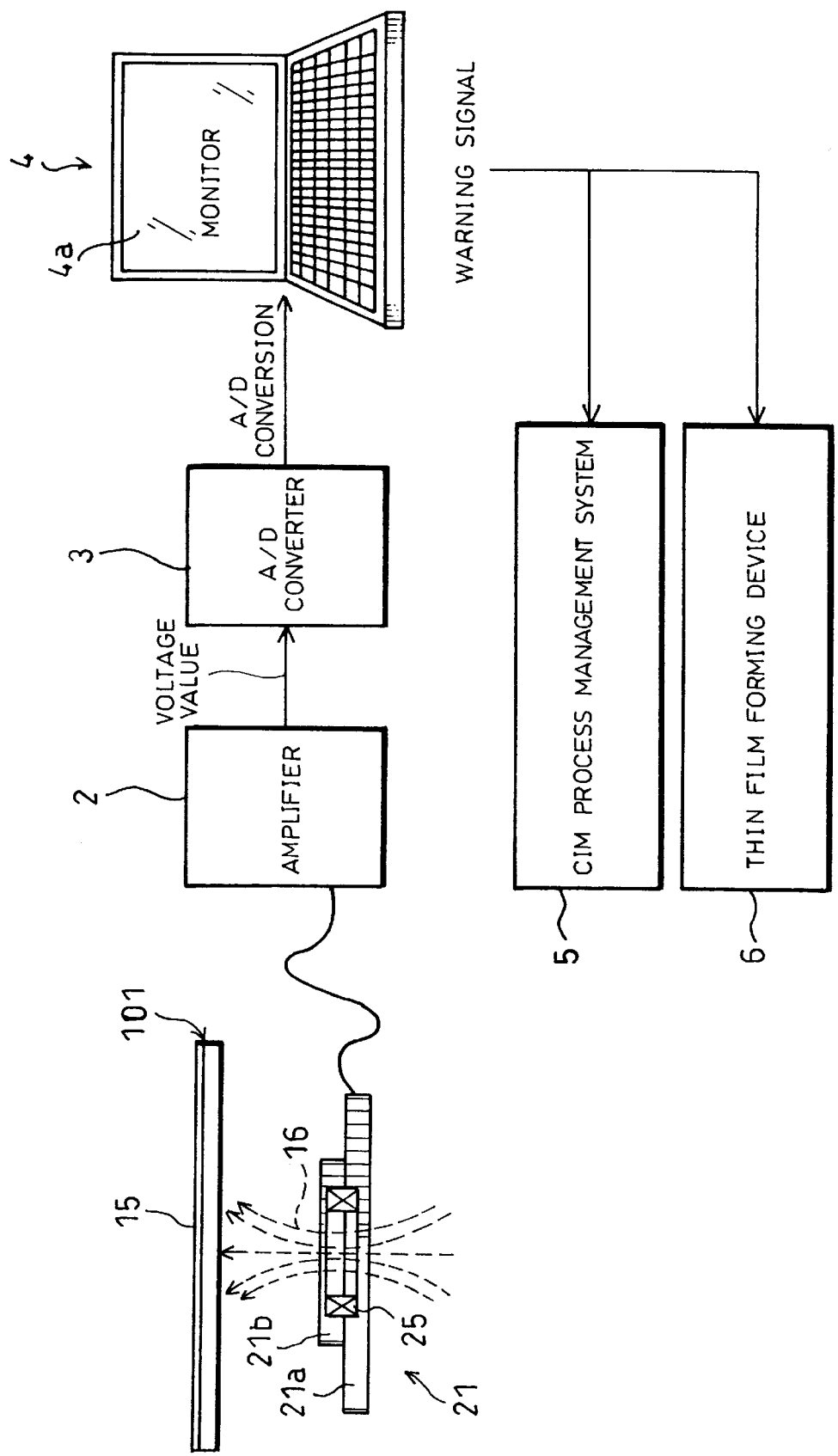
FIG. 10 is a schematic drawing showing a configuration of a sheet resistance measurement system incorporating the sheet resistance meter shown in FIG. 6.

Accordingly, the sensor head 21 measures the sheet resistance value of the thin-film metal 15 through the back side of the semiconductor wafer 101, that is, oppositely to the side, of the semiconductor wafer 101, on which the thin-film metal 15 is formed, as shown in FIG. 10. In the same manner as in the first embodiment, the signal detected by the sensor head 21 is supplied to the amplifier 2, the A-to-D converter 3, and the controller 4, and if it is determined in the controller 4 that the sheet resistance value of the thin-film metal 15 formed on the semiconductor wafer 101 is abnormal, the controller 4 outputs a warning signal representative of the abnormality to the CIM process management system 5 and the thin film forming device 6.

Figure 11:
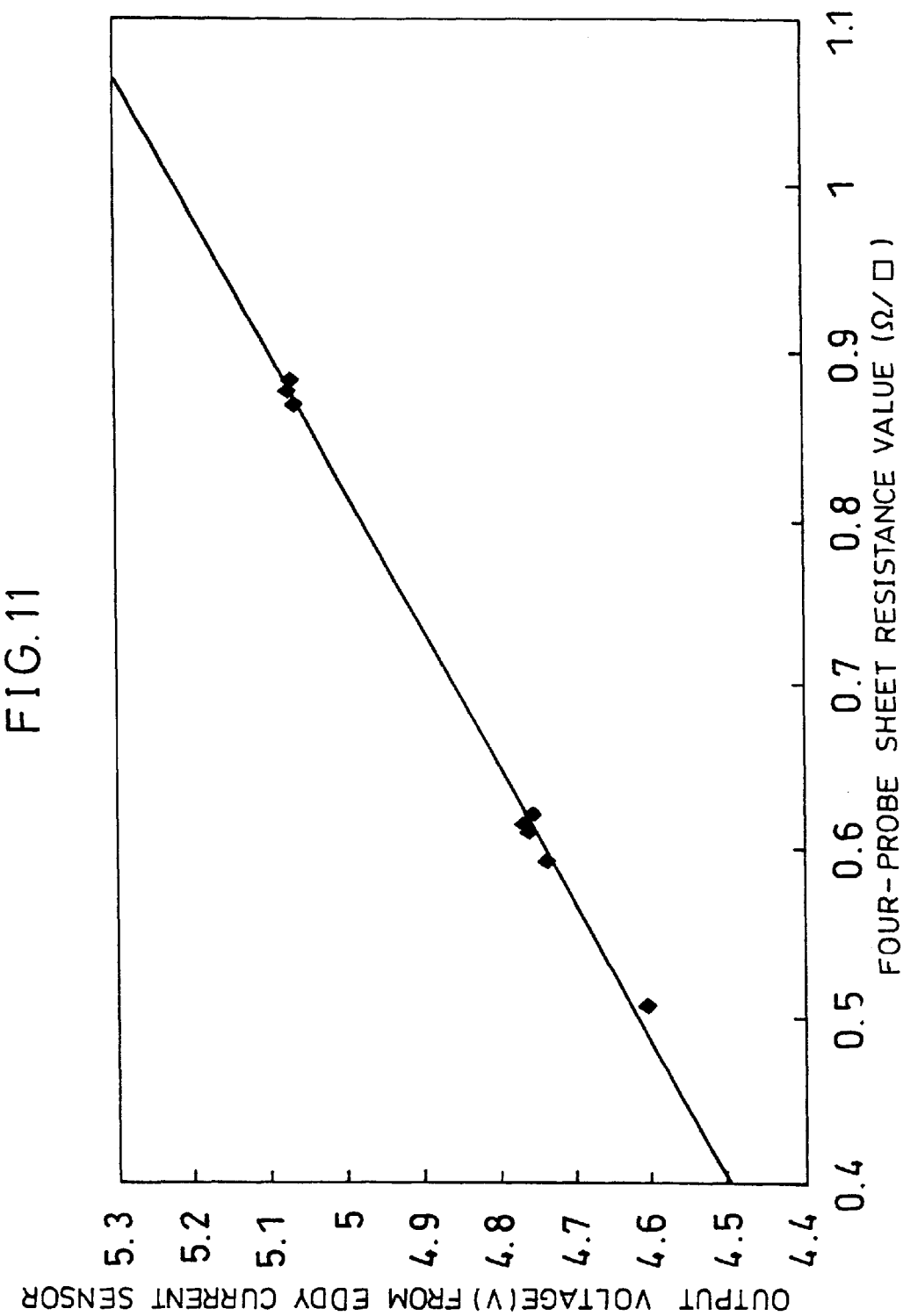
FIG. 11 is a graph showing a sheet-resistance-value-correction straight line used when the sheet resistance meter shown in FIG. 6 is distanced 2 mm from the thin film.

The graph constituting FIG. 11 shows properties of the sensor head 21 arranged as above in the detection of sheet resistance values.

The graph constituting FIG. 11 shows a sheet-resistance-value-correction straight line obtained from measurements of the sheet resistances of 9 kinds of thin-film metal samples by four-probe sheet resistance scheme and measurements of the output voltages of the same 9 kinds of thin-film metal samples using the sensor head 21. The sheet-resistance-value-correction straight line is given by, Y=1.2126X+ 4.0103, where Y represents an output voltage and X represents a sheet resistance value.

Accordingly, the sheet resistance value X can be obtained from the sheet-resistance-value-correction straight line by substituting for Y the output voltage obtained using the eddy-current-type sheet resistance meter incorporating the sensor head 21 of the present embodiment.

Further, it is understood from the slope of the sheet-resistance-value-correction straight line shown in FIG. 11 that the eddy-current-type sheet resistance meter of the present embodiment has a detection sensitivity three times that of the eddy-current-type sheet resistance meter of the first embodiment. Specifically, the sheet-resistance-value-correction straight line shown in FIG. 4 has a slope of 0.4835, whereas the sheet-resistance-value-correction straight line shown in FIG. 11 has a slope of 1.2126.

Accordingly, by using the sensor head 21 of the present embodiment, the sheet resistance value becomes detectable of thin films that are more resistant than the Al, Ta, and other low-resistance-metal thin films.

From the foregoing, the thickness of the sensor head 21 is successfully reduced over that of the sensor head 1 of the first embodiment, without degrading the detection sensitivity, which allows the sensor head 21 to be used embedded in the robot hand 31.

This in turn imparts to the robot hand 31 a capability to determine whether or not the sheet resistance value of the thin-film metal 15 formed on the semiconductor wafer 101 which is being transported along the manufacturing line is normal, and another capability, if it is determined that the sheet resistance value is abnormal, to immediately remove the semiconductor wafer 101.

This effectively prevents semiconductor wafers 101 with an abnormal sheet resistance value to be transported through to the last step in the manufacturing line, in other words, allows only semiconductor wafers 101 with a normal sheet resistance value to be transported. As a result, the semiconductor wafer 101 needs to undergo an operability test nowhere but at the place where the detection of the sheet resistance value is performed, thereby improving operational efficiency.

Incidentally, generally, a sensor head including a coil with a ferrite core inserted therein has an improved sensitivity than a sensor head including a mere coil with no ferrite core. This is because the ferrite core inserted in the coil can generate a dense magnetic flux along the co-axis in the center of the coil with high efficiency.

Accordingly, in the present embodiment, a ferrite core 24 is inserted in the coil 25 so as to enhance the sensitivity of the sensor head 21 by generating a dense magnetic flux along the co-axis with high efficiency. There is, however, a likelihood of some problems arising.

For example, the electrical power supplied to the coil 25 needs to be in high frequencies to enhance the sensitivity of the sensor head 21. However, if the electrical power supplied to the coil 25 is in high frequencies, the coil 25 becomes heated, causing drifts in the output voltage.

Specifically, if the sensor head 21 is activated in-line, temperature changes in the ferrite core 24 and the coil 25, causing the detected output voltage to start drifting. As a result, the measurement of the sheet resistance value becomes instable. This creates the need to correct measurements of the sheet resistance value in accordance with temperature changes, and further leads to problems such as reduced operational efficiency in the detection of the sheet resistance value.

Figure 27:
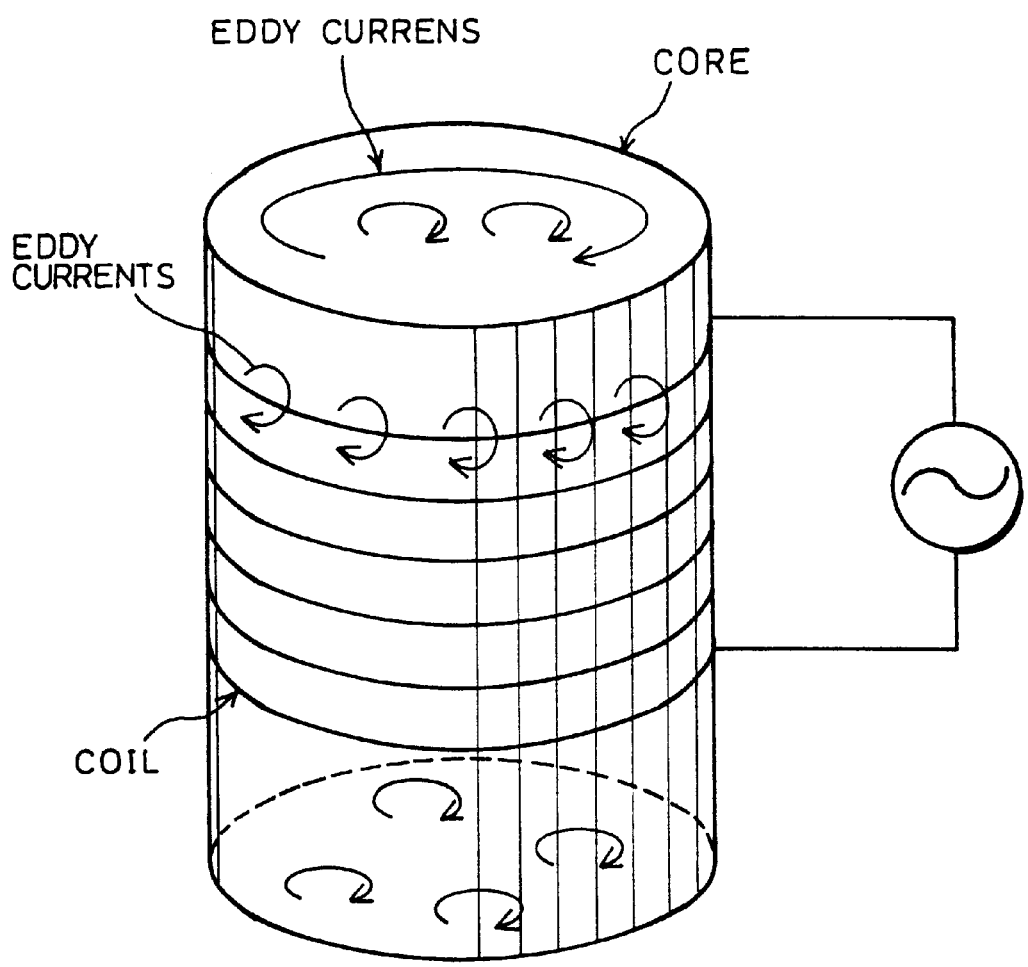
FIG. 27 is an explanatory view showing eddy currents induced between the coil and the ferrite core.
Figure 28:
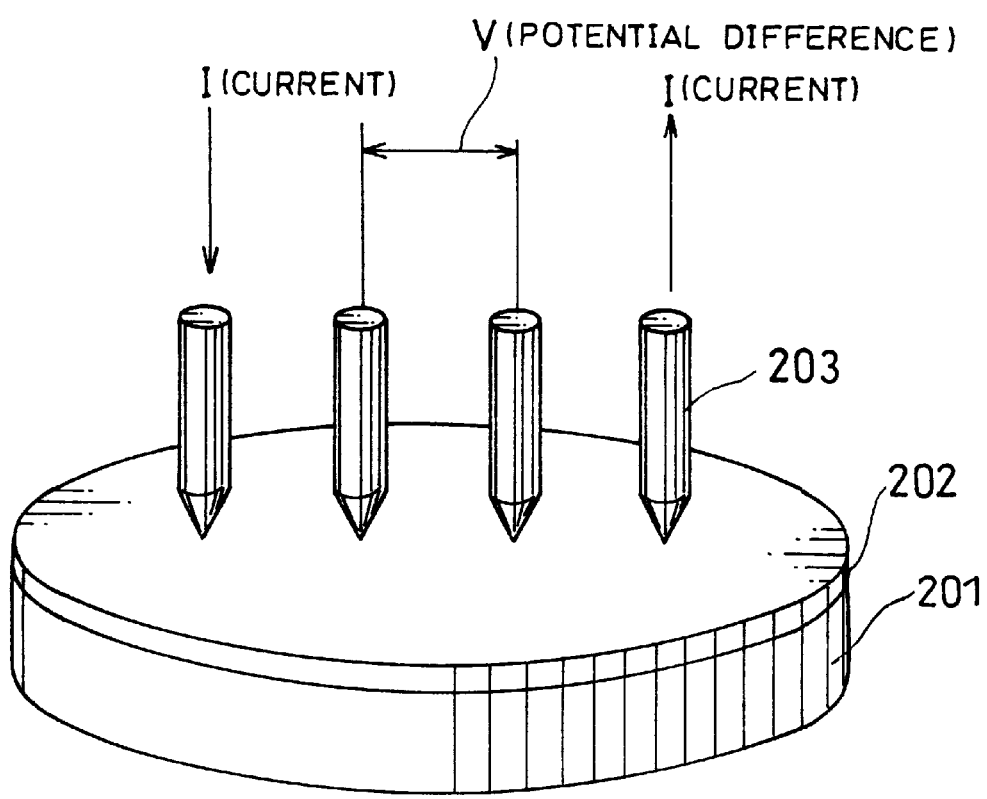
FIG. 28 is an explanatory view showing principle in sheet resistance measurement according to a four-probe scheme.

As an a.c. current is passed through the coil wound around a conductive core material, eddy currents start flowing in the core as well as in the coil as shown in FIG. 27. The eddy currents turn into heat due to the electrical resistance of the core, causing dissipation. Therefore, a core material with little dissipation, low conductance, and high permeability should be selected.

Accordingly, the core material and the coil are disposed so as not to contact each other for the purpose of reducing the eddy current loss to some extent. Specifically, the core is insulated by a thin insulative plate, or a dust core is used.

In the present embodiment, a magnetic core material is disposed so as not to contact the coil.

The disposition of the magnetic material so as not to contact the coil greatly reduces eddy currents that are induced in the magnetic material as an a.c. current is passed through the coil to generate a magnetic field. As a result, the eddy current loss in the coil is less affected by the eddy current loss in the magnetic material, and the sheet resistance can be precisely detected in accordance with the eddy current loss in the sensor head.

Preferably, in order to prevent drift in the output voltage and thereby stabilize the measurement of the sheet resistance value, a coreless sensor head, i.e., a sensor head with no ferrite core, is used. Specifically, a sensor head that only includes a coil constituted by a copper wire wound in turns is preferably used.

In the third embodiment below, a coreless sensor head will be explained.

Embodiment 3

Referring to FIG. 12 to FIG. 21, the following description will discuss a further embodiment in accordance with the present invention. The eddy-current-type sheet resistance meter of the present embodiment includes a coreless sensor head 41 as shown in FIG. 12. Here, for convenience, members of the present embodiment that have the same arrangement and function as members of the first and second embodiments, and that are mentioned in the first and second embodiments are indicated by the same reference numerals and description thereof is omitted.

The sensor head 41 is constituted by a coil 42 alone that is connected to a high frequency generation circuit 13 disposed in the amplifier 2 explained in the first embodiment. The mechanism of the sensor head 41 generating the eddy currents 17 in the thin-film metal 15 on the semiconductor wafer 101 is identical to that in the first embodiment, and detailed explanation thereof is therefore omitted.

Figure 13A:
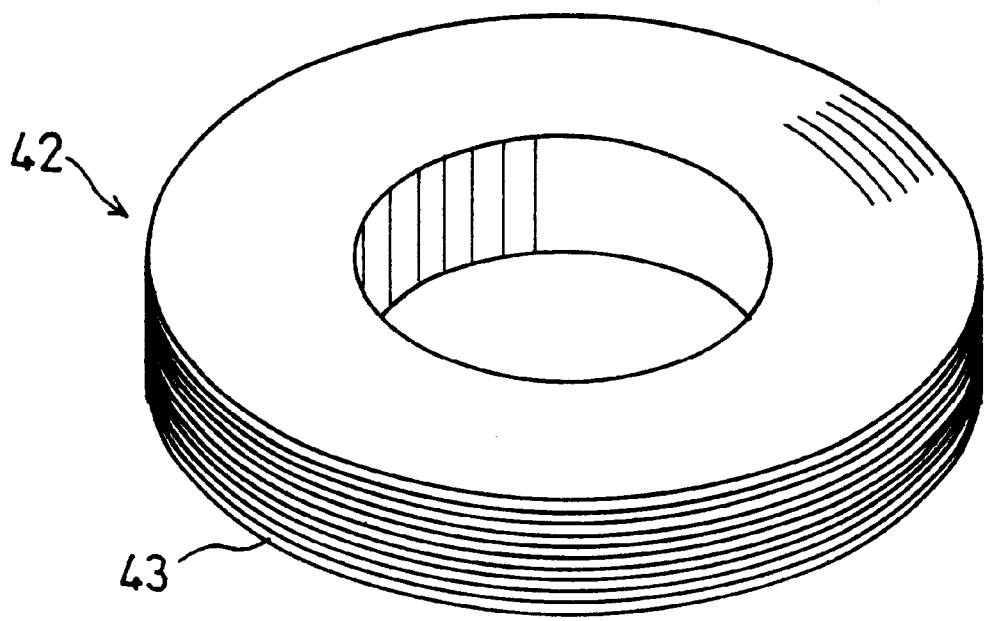
FIG. 13(*a*) is a perspective view showing a coil section of the sensor head shown in FIG. 12.
Figure 13B:
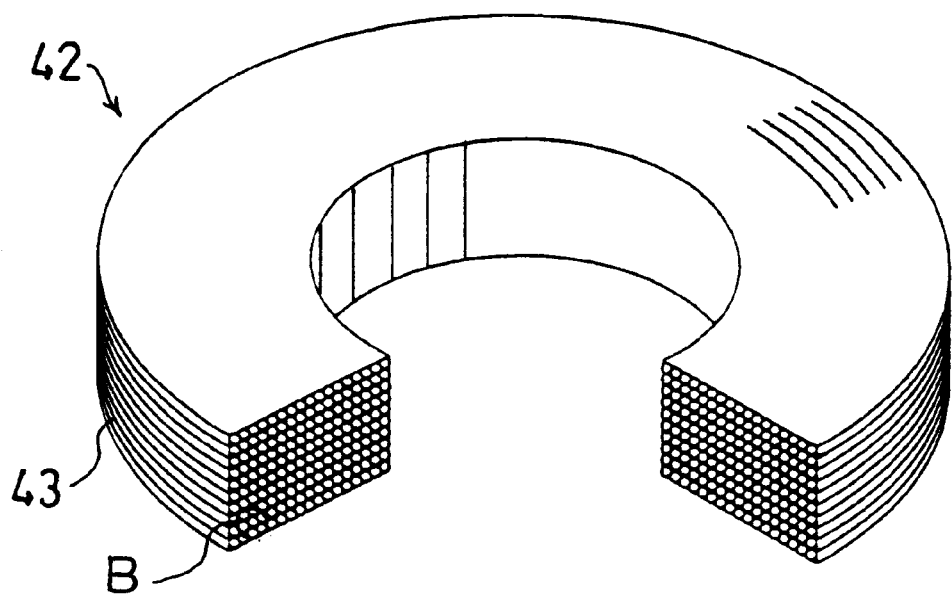

The coil 42 is constituted by a conducting wire 43 made of copper or the like and wound in turns as shown in FIG. 13(a) and FIG. 13(b).

The sensor head 41 arranged as in the foregoing includes no core. Therefore, an observation reveals that the sensor head 41 has a reduced sensitivity over that of the sensor head 21 of the second embodiment including a core inserted in the coil. Therefore, an electric power containing higher frequencies is supplied to the coil 42 to enhance the sensitivity of the sensor head 41.

This arrangement imparts to the coreless sensor head 41 the same level detection sensitivity as that of the sensor head 21 described earlier in the second embodiment.

Further, since the sensor head 41 includes no core, the output voltage has an improved temperature characteristic: the output voltage no longer drifts, stabilizing the measurement of the sheet resistance value. Accordingly, correction on the measurement of the sheet resistance value in accordance with temperature changes is no longer necessary, and reduced operational efficiency in the detection of the sheet resistance value can be now prevented.

Besides, since the sensor head 41 includes no core, it is not affected by, for example, the thickness of the ferrite core, which makes it possible to design the sensor head 41 with a further reduced thickness.

Further, the sensor head 41 can be made simply by windings of the coil 42, which allows more versatile design in line with the configuration of the existent manufacturing line. Further, since the sensor head 41 includes no core, the manufacturing cost of the sensor head 41 is greatly reduced.

Figure 14A:
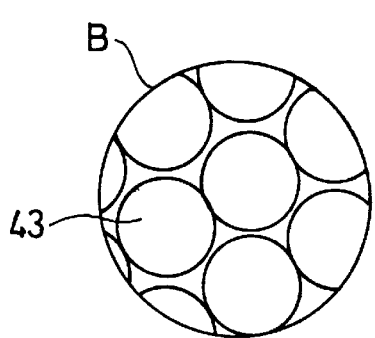
FIG. 14(*a*) is an enlarged cross-sectional view showing conducting wires each constituted by a singlestranded copper filament, in a major part B shown in FIG. 13(*b*).
FIG. 14(b) is an enlarged cross-sectional view showing conducting wires each constituted by a Litzendraht wire made up of twisted copper filaments, in a major part B shown in FIG. 13(b).
Figure 14B:
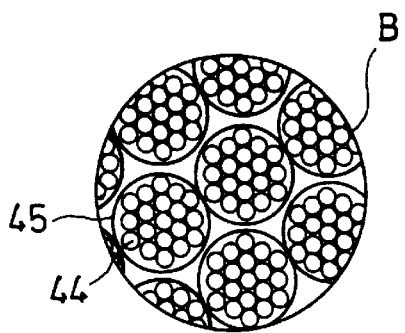

The coil 42, since being constituted by windings of a singlestranded conducting wire 43 as shown in FIG. 14(*a*), increases its a.c. resistance with increasing frequency of the applied high frequency electric power, and causes so-called skin effect, a phenomenon where the current flow is confined to the surface of the conducting wire 43. Therefore, the sensor head 41, including the coil 42 constituted by windings of the singlestranded conducting wire 43, has limits in improving sensitivity thereof.

Accordingly, a multistranded wire (hereinafter, will be referred to as a Litzendraht wire) 45 constituted by a plurality of twisted small copper wires 44 may be possibly used in place of the singlestranded conducting wire 43 as shown in FIG. 14(*b*). In such an event, in high frequencies, skin effect occurs in each copper wire 44; however, since the copper wire 44 are twisted, the Litzendraht wire 45 can carry the current efficiently. Accordingly, in high frequencies, the coil 42 including the Litzendraht wire 45 has a reduced a.c. resistance and hence reduced skin effect, thereby improving the sensitivity of the coil 42.

FIG. 14(*a*) and FIG. 14(*b*) are enlarged cross-sectional views showing a major part B of the coil 42 shown in FIG. 13(*b*).

In the foregoing arrangement, the Litzendraht wire 45 is wound to form a coil 42 as a coreless sensor head 41, the sheet resistance can be stably measured in high frequencies, successfully improving sensitivity in the detection of the sheet resistance value. This enables measurement of the sheet resistance of ITO (Indium Tin Oxide) and other high-resistance thin films.

The first and second embodiments, among the three embodiments explained so far, adopt an amplifier 2 for use with a conventional distance sensor. Therefore, the eddy-current-type sheet resistance meter has limitations in improving sensitivity thereof.

Accordingly, the following description will explain a method (an amplifier detection method and a coil evaluation method) to find an amplifier and a coil that would allow improvements on the sensitivity of the eddy-current-type sheet resistance meter.

First, a method of evaluating a coil of the sensor head incorporated in the eddy-current-type sheet resistance meter and a method of detection using an amplifier connected to a coil will be explained. Subsequently, the circuit used in the coil evaluation method and the amplifier detection method will be explained in relation to its application in an eddy-current-type sheet resistance meter.

First, a method of evaluating a coil of the sensor head and a method of detection using an amplifier connected to a coil will be explained. In the description, a resonant circuit shown in FIG. 15 is employed as an equivalent circuit to the eddy-current-type sheet resistance meter.

Figure 15:
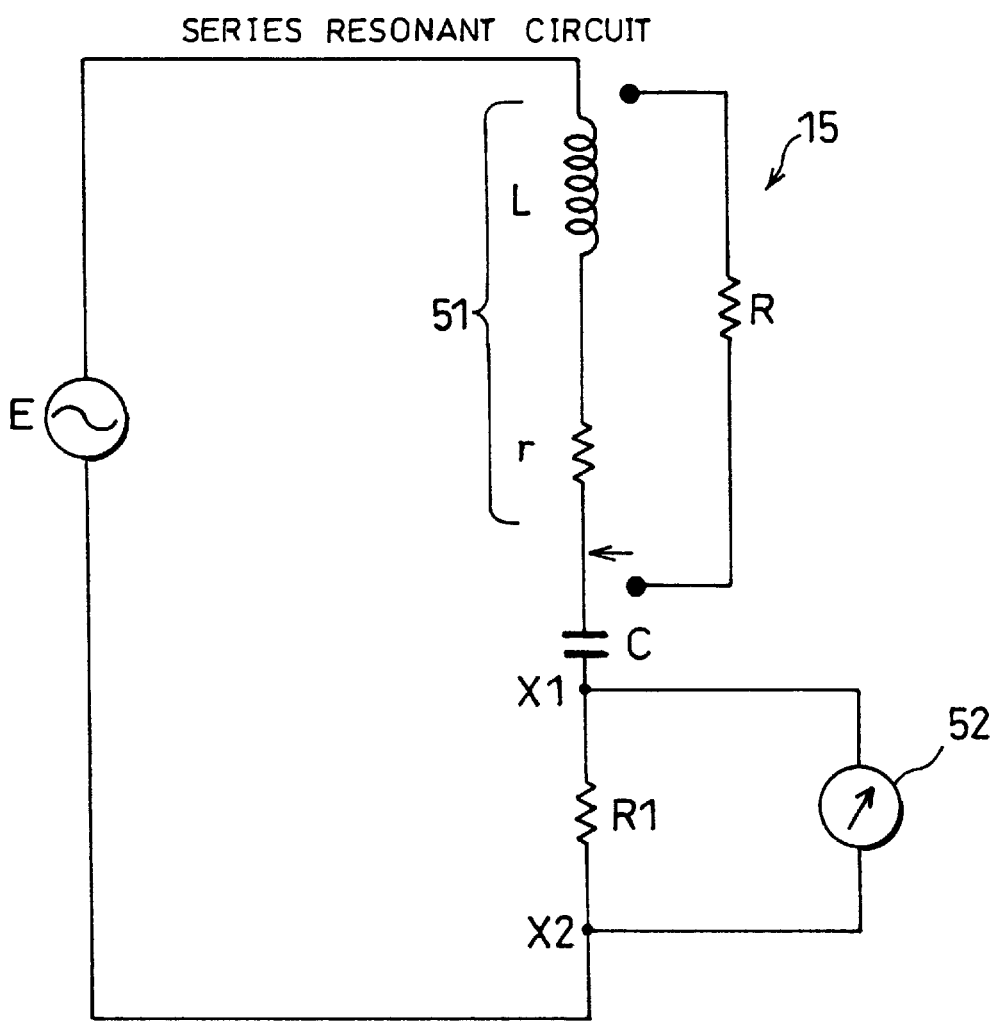
FIG. 15 is a diagram showing a series resonant circuit as an equivalent circuit to a sheet resistance meter of still another embodiment in accordance with the present invention.

The resonant circuit is a series resonant circuit in which a coil 51, a capacitor C, and a resistance R1, and a power supply source E are connected in series as shown in FIG. 15.

The capacitor C is a variable capacitor that can vary its capacitance. Note that when the capacitor C is actually used as an amplifier, since the object to be measured has a fixed sheet resistance value, the capacitance of the capacitor C is also fixed.

Further, the resonant circuit includes a voltmeter 52 for detecting a variation in the current flowing through the resistance R1 as a voltage.

The voltmeter 52 measures the potential difference across the both ends (the points X1 and X2) of the resistance R1. It is desirable to directly measure the high frequency a.c. current contributing to the real eddy current loss. However, this is almost impossible. In actual practice, as mentioned above, a resistance R1 is disposed, and the current is calculated based on the equation, V=R·I.

In the resonant circuit arranged as in the foregoing, even a small current flowing between the point X1 and the point X2 can generate a relatively large potential difference across the point X1 and the point X2, because the resistance R1 is connected between the point X1 and the point X2. This enables a small current corresponding to an eddy current loss to be translated into a voltage and thus detected.

Further, if an ammeter is used to detect the current flowing between the point X1 and the point X, the ammeter needs to be capable of detecting even minimal current. Such an ammeter is very costly, adding greatly to the manufacturing cost of the sheet resistance meter.

However, as mentioned earlier, if the current flowing between the point X1 and the point X2 is translated into voltage, even a small current results in a large voltage value when translated, and thus becomes detectable using a voltmeter having a relatively low sensitivity.

Accordingly, the use of the voltmeter 52 in the resonant circuit as in the present embodiment can greatly reduce the manufacturing cost of the sheet resistance meter compared to the use of an ammeter.

Further, since even a minimal current, when translated by the resistance R1 into voltage, results in a large voltage value, the voltmeter is sufficiently responsive.

This enables precise measurement of the sheet resistance of ITO and other high-resistance thin films.

Further, even if the oscilloscope, which is a reliable measuring instrument, is used to measure the voltage, the capacitance of the oscilloscope per se, as well as that of the probes, affects the measurement. Accordingly, in the present invention, since an IC is used for immediately calculating, from the obtained a.c. voltage value, an effective value of a d.c. voltage that corresponds to high frequencies (2 MHz) in an amplifier; therefore, the voltage is detectable using a typical, inexpensive voltmeter without being negatively affected by the stray capacitance of the measuring instrument per se.

In the resonant circuit, as the thin-film metal 15 approaches the coil 51, a mutual electromagnetic induction phenomenon occurs, Q of the entire resonant circuit decreases, and electrical power dissipates in the resonant circuit. Here, the distance between the thin-film metal 15 and the coil 51 is set to a constant value.

Since the resistance of the coil 51 is presumably constituted only by an internal resistance R, it would be safe to assume that as the coil 51 is brought in close proximity of the thin-film metal 15, the metal film resistance R of the thin-film metal 15 is in parallel to the internal resistance R. In such conditions, the coil 51 shows lower levels of resonance properties on the whole.

In this manner, if the aforementioned principle of a resonant circuit is applied to the eddy-current-type sheet resistance meter, minimal changes in a film property of a thin film becomes detectable by reading a few % variation in the eddy current loss of the dissipation of electrical power in the resonant circuit due to the thin-film metal 15 positioned in close proximity to the coil 51, drawing a correction straight line based on the correlation between the readings and the sheet resistance value that serves as a correction-use sample reference value, and translating the voltage variation measurement to an equivalent sheet resistance value according to the correction straight line.

Figure 16:
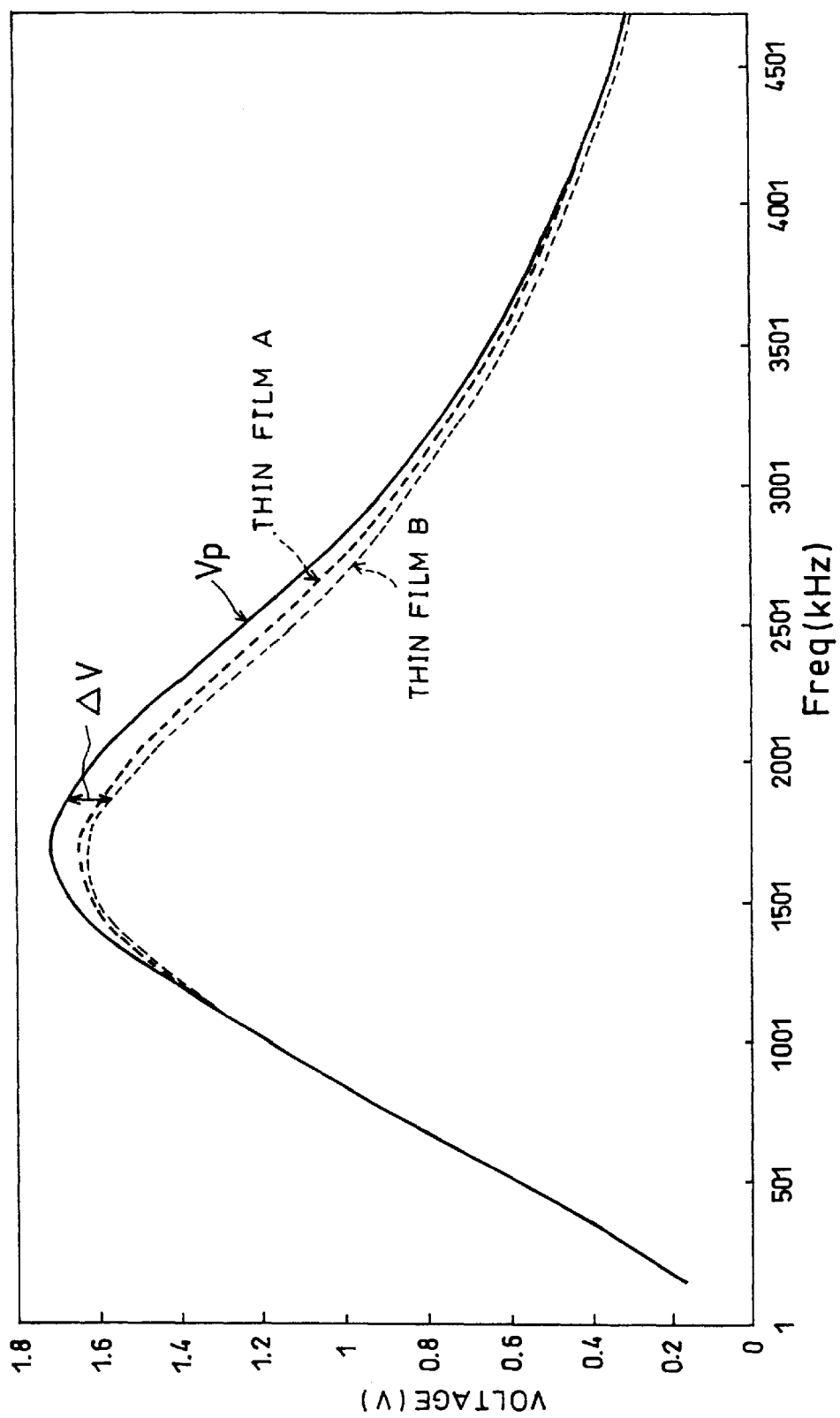
FIG. 16 is a graph showing correlation between resonance properties of the coil in the series resonant circuit shown in FIG. 15 when two thin films having different sheet resistance values from each other are brought in close proximity and when not.

For example, FIG. 16 is a graph showing results of examination on the relationship between drive frequencies (kHz) and voltage $V_o$ when thin films A and B having different sheet resistance values from each other are brought within a predetermined distance from the coil 51 and the relationship between drive frequencies and voltage $V_p$ when they are not.

The graph constituting FIG. 16 shows that the voltage value decreases, i.e., the frequency characteristic has changed, when the thin film A and the thin film B are brought in close proximity to the coil 51.

Accordingly, $\Delta V = V_p - V_o$, that is, the difference between the voltage $V_o$ (represented by dotted lines in FIG. 16) when thin films A and B having different sheet resistance values from each other are brought in close proximity to the coil 51 and the voltage $V_p$ when they are not, takes its maximum value at a frequency a few % off those resonant frequencies at which the voltage $V_p$ and $V_o$ have their peaks. That frequency at which $\Delta V$ is maximum is set as the drive frequency for the coil 51. Hence, the $\Delta V$ represents sensor sensitivity: the greater $\Delta V$, the higher the sensor sensitivity.

As mentioned in the foregoing, $\Delta V$ takes its maximum value at a frequency a few % off those resonant frequencies, and that resonant frequency is preferably designated as the drive frequency for the coil 51. Alternatively, the drive frequency for the coil 51 may be specified to any value as long as it allows the sheet resistance to be properly detected and measured. Specifically, the drive frequency of the coil 51 may be specified according to the kind of the thin film. Table 2 below shows correlation between the sheet resistance values and optimal drive frequencies for some particular kinds of films.

TABLE 2

| Film | Sheet Resistance (Ω/□) | Drive Frequency (kHz) |
| --- | --- | --- |
| Ta | 0.7 | 280 to 310 |
|  | 5 | 540 to 560 |
| ITO | 20 | 800 to 820 |

As shown in Table 2, the drive frequency of the coil 51 can be specified so as to be optimal according to the kind of the thin film.

The use of an eddy-current-type sheet resistance meter including a coil 51 of which the drive frequency is specified in the above manner enables the detection of the sheet resistance value of a thin film with sufficient sensitivity, and thereby enables the detection of the sheet resistance value of ITO and other high-resistance thin films Typically, in a resonant circuit, the resonant frequency representative of a resonance property of the coil 51 changes with a change in the capacitance of the capacitor C. For example, FIG. 17 is a graph showing correlation between capacities of the capacitor C and resonant frequencies of the resonant circuit shown in FIG. 15.

Figure 17:
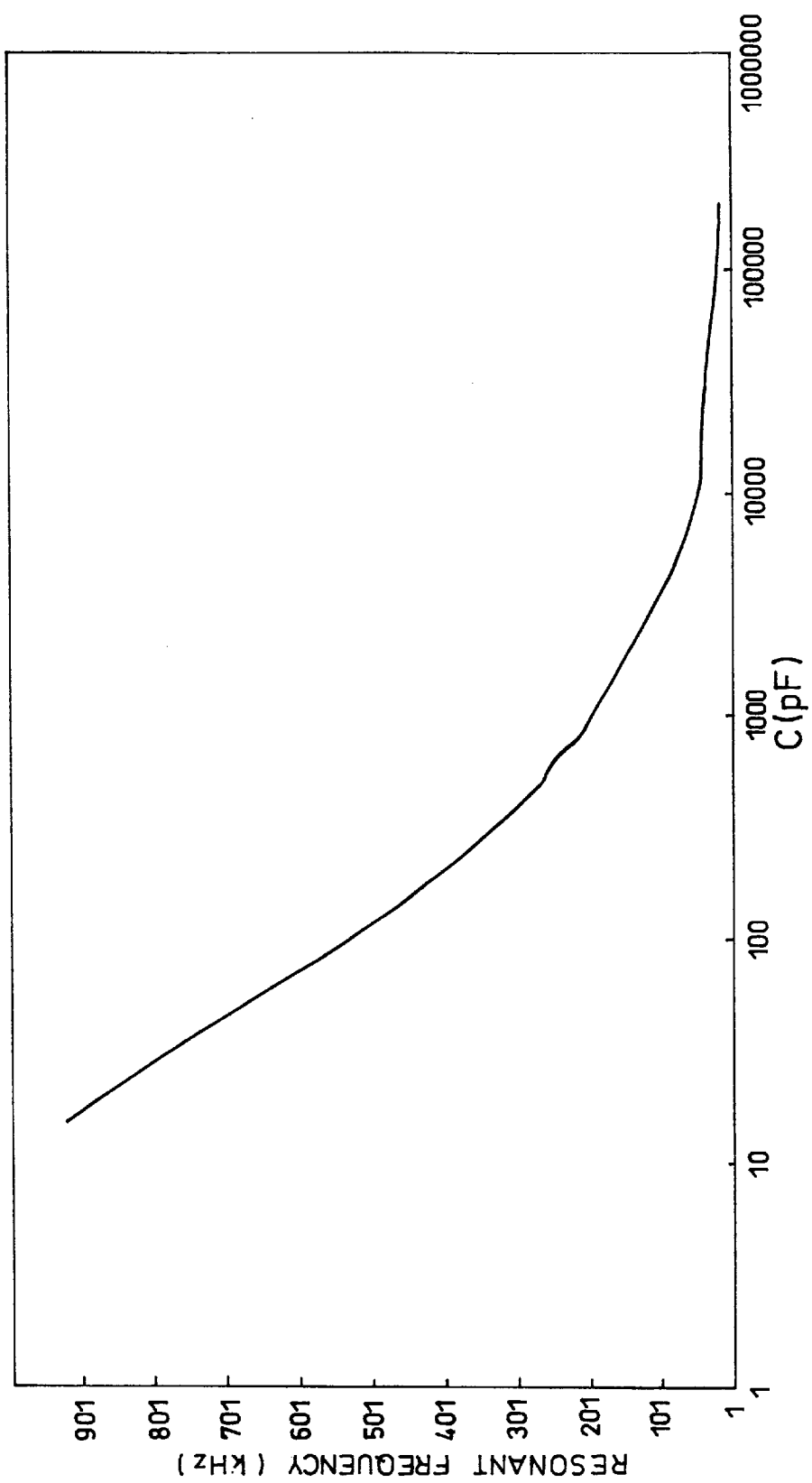
FIG. 17 is a graph showing correlation between capacities and resonant frequencies of the coil in the series resonant circuit shown in FIG. 15.

The graph constituting FIG. 17 shows that the smaller the capacitance of the capacitor C, the higher the resonant frequency.

Accordingly, when a resonant circuit is used in the sheet resistance meter, the drive frequency of the coil 51 should be adjusted by varying the capacitance of the capacitor C so that the coil 51 has a maximum sheet resistance detection sensitivity. In such a case, the drive frequency of the coil 51 should be adjusted by varying the capacitance of the capacitor C so as to be optimal according to the kind of the thin film as shown in Table 2, for example.

Figure 18:
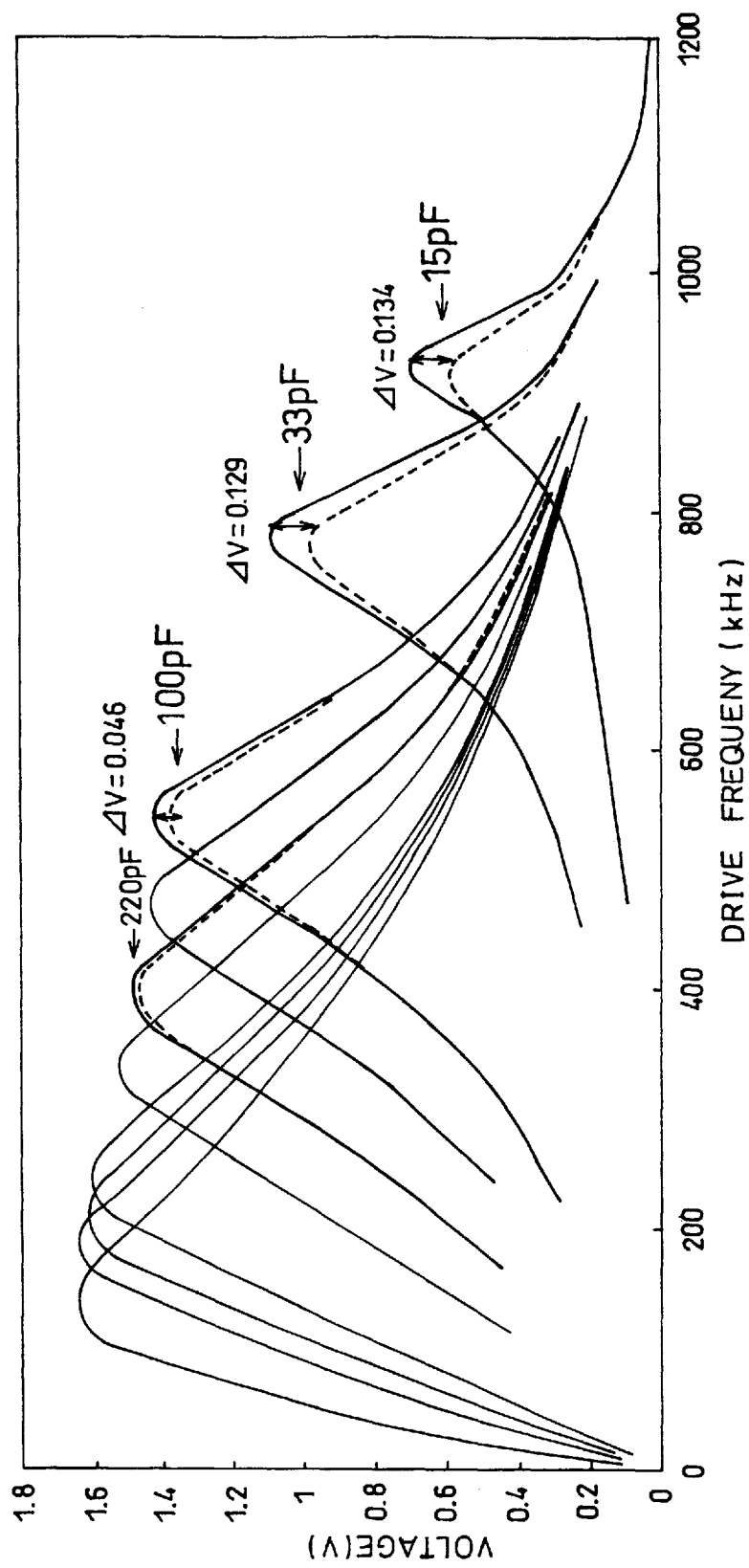
FIG. 18 is a graph showing correlation between capacities and resonance properties when the coil in the series resonant circuit shown in FIG. 15 is constituted by singlestranded copper filaments.
Figure 19:
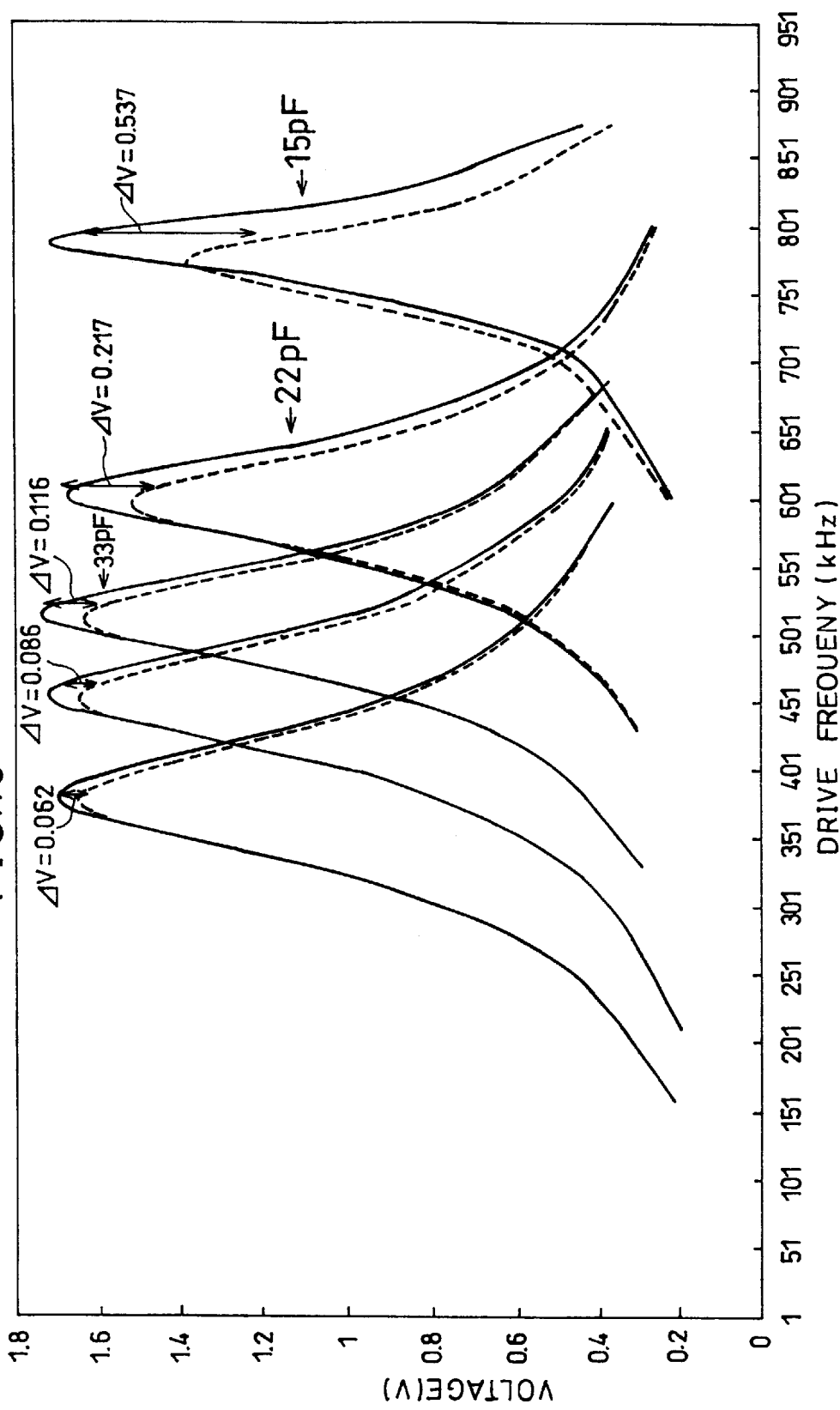
FIG. 19 is a graph showing correlation between capacities and resonance properties when the coil in the series resonant circuit shown in FIG. 15 is constituted by Litzendraht wires.

FIG. 18 and FIG. 19 are graphs showing resonance property, i.e., a correlation between drive frequencies and voltages across the resistor R1, for two kinds of coils each including a variable capacitor C. Note that $\Delta V$ shown in each graph represent maximum values thereof with respect to the capacitance of each capacitor C.

The graph constituting FIG. 18 shows results when a coreless singlestranded coil is used that is prepared by winding a 0.07 mm copper wire.

The graph constituting FIG. 19 shows results when a coreless Litzendraht wire coil is used that is prepared by winding a Litzendraht wire constituted by 40 twisted 0.07 mm copper wires.

The graph constituting FIG. 18 and FIG. 19 show that as to both the singlestranded wire coil and the Litzendraht wire coil, the smaller the capacitance of the capacitor C, the higher the resonant frequency corresponding to the peak of the voltage value, and the greater $\Delta V$. Accordingly, it is understood that the sensitivity in the detection of the sheet resistance value improves as the resonant frequency increases.

However, it is also shown that the Litzendraht wire coil has a greater $\Delta V$ than the singlestranded wire coil if the capacitors C have the same capacitance. For example, at the resonant frequency of about 800 kHz, the singlestranded wire coil has a $\Delta V$ of 0.129, whereas the Litzendraht wire coil has a $\Delta V$ of 0.537, which can be interpreted as meaning that the Litzendraht wire coil has a detection sensitivity for the sheet resistance value about 4 times that of the singlestranded wire coil.

In other words, the Litzendraht wire coil has a smaller dissipation of high frequency electric power and a lower a.c. resistance, and therefore shows a greater $\Delta V$ at the same resonant frequency than the singlestranded wire coil when incorporated in a resonant circuit. Accordingly, when incorporated in an eddy-current-type sheet resistance meter, the Litzendraht wire coil can impart a higher sensitivity to an eddy-current-type sheet resistance meter than can the singlestranded wire coil.

Generally, in a resonant circuit, at a resonant frequency higher than 800 kHz, the temperature of the coil drifts due to an increase in the internal temperature of the circuit. This will builds up an additional workload on the resonant circuit, i.e., on the amplifier constituting the power supply source E, etc., and causes stability problems. An amplifier with improved performance needs to be used to reduce the workload at high frequencies, which is costly.

Therefore, at high resonant frequencies, the drive frequency (resonant frequency) of the eddy-current-type sheet resistance meter needs to be specified to produce a detection sensitivity that best fits to the thin film, i.e., an object to be measured, in consideration of the properties of the thin film and tradeoffs among various conditions in detection of the sheet resistance.

Meanwhile, in a resonant circuit, at resonant frequencies as low as 800 kHz and lower, the coil temperature presents a smaller drift, and both the amplifier and the coil are stable.

Now, as mentioned earlier, the series resonant circuit specified by the method of evaluating the coil of the sensor head and the method of detection using an amplifier connected to the coil will be explained in relation to its application in an eddy-current-type sheet resistance meter.

Figure 20:
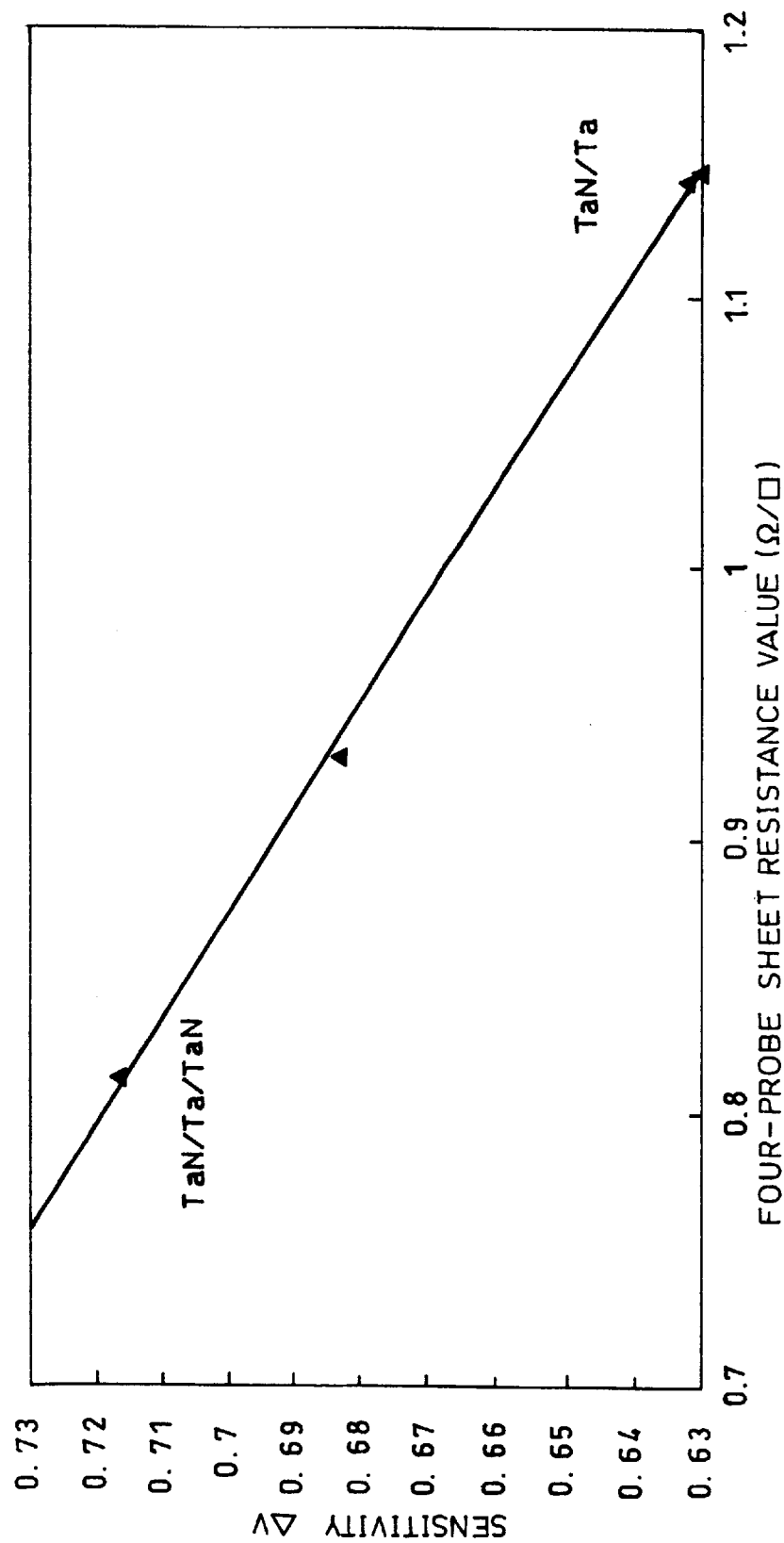
FIG. 20 is a graph showing detection properties of the sheet resistance value of a Ta thin film when the coil in the series resonant circuit shown in FIG. 15 is constituted by Litzendraht wires.
Figure 21:
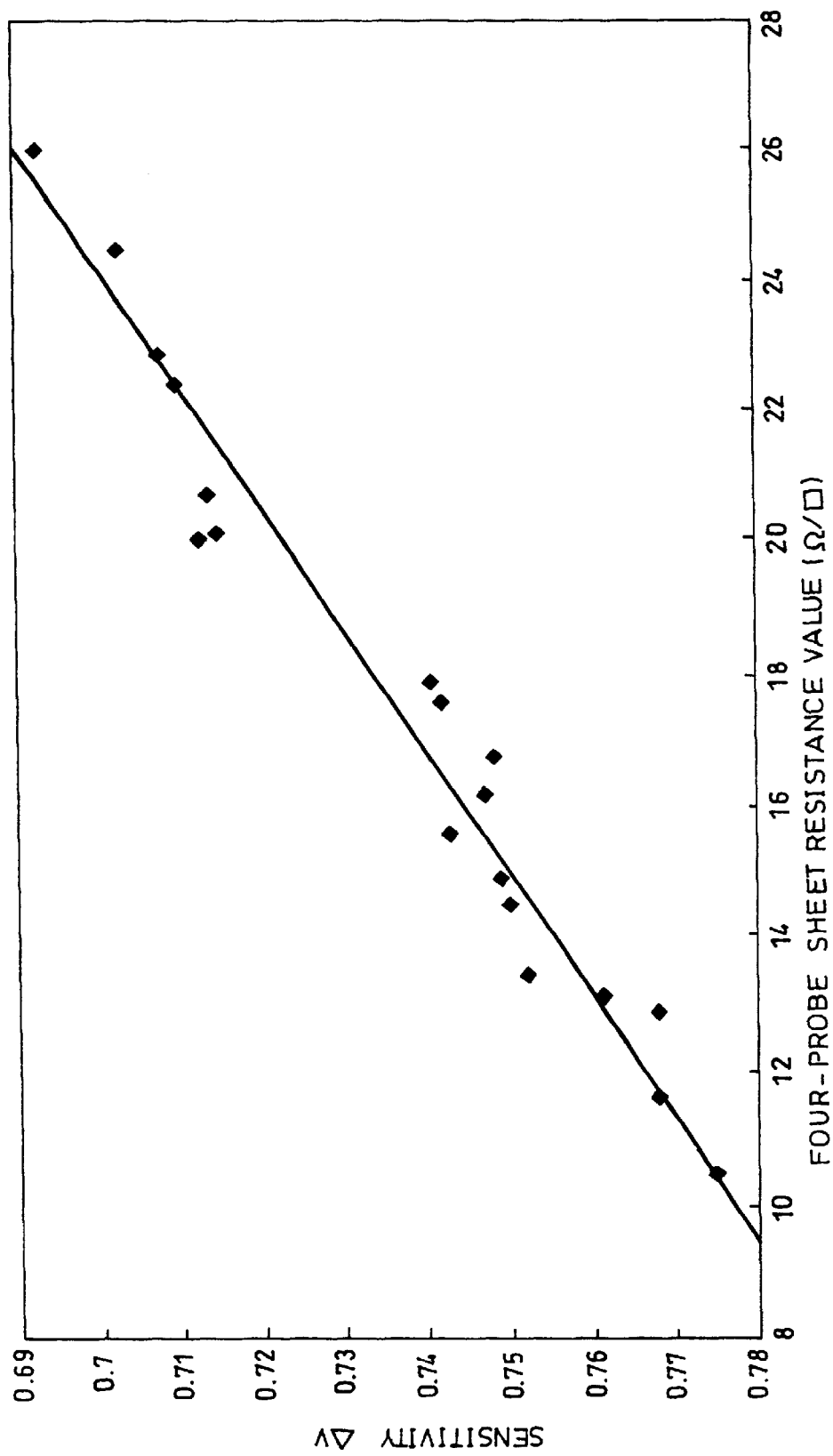
FIG. 21 is a graph showing detection properties of the sheet resistance value of an ITO film when the coil in the series resonant circuit shown in FIG. 15 is constituted by Litzendraht wires.

Here, an eddy-current-type sheet resistance meter will be explained that includes a Litzendraht wire coil as a sensor head. The graphs constituting FIG. 20 and FIG. 21 show detection properties of the eddy-current-type sheet resistance meter for a sheet resistance value. In FIG. 20 and FIG. 21, $\Delta V$ representative of sensitivity is used as the output voltage.

The graph constituting FIG. 20 is obtained from measurements of the sheet resistance value of a Ta thin film. Specifically, the graph shows that the sheet resistance is detectable when it is within ±5% of 0.8Ω/□, which is a reference for the sheet resistance in the formation of a Ta thin film on a liquid crystal substrate as a semiconductor substrate, at a sensitivity ($\Delta V$) where conditions are specified so that the series circuit resonates at a resonant frequency of about 380 kHz.

In other words, the sheet-resistance-value-correction straight line shown in the graph constituting FIG. 20 is drawn by plotting the sheet resistance values obtained from measurement performed on some Ta thin films with different sheet resistance values using a four-probe sheet resistance scheme against the $\Delta V$ (sensitivity) in the output voltage obtained from measurement performed on the same Ta thin films using an eddy-current-type sheet resistance meter. The sheet-resistance-value-correction straight line is given by: $Y=-0.2559X+0.9235$, where Y represents $\Delta V$ and X represents the sheet resistance value.

The graph constituting FIG. 21 is obtained from measurements of the sheet resistance value of an ITO film. Specifically, the graph shows that the sheet resistance is detectable when it is within ±9.5% of 15Ω/□ to 20Ω/□, which is a reference for the sheet resistance in the formation of an ITO film on the same surface as a color filter of the liquid crystal substrate, at a sensitivity ($\Delta V$) where conditions are specified so that the series circuit resonates at a resonant frequency of about 820 kHz.

In other words, the sheet-resistance-value-correction straight line shown in the graph constituting FIG. 21 is drawn by plotting the sheet resistance values obtained from measurement performed on some ITO films with different sheet resistance values using a four-probe sheet resistance scheme against the $\Delta V$ (sensitivity) in the output voltage obtained from measurement performed on the same ITO films using an eddy-current-type sheet resistance meter. The sheet-resistance-value-correction straight line is given by: $Y=-0.0054X+0.8312$, where Y represents $\Delta V$ and X represents the sheet resistance value.

Using the coil and amplifier evaluated as in the foregoing, the sheet resistances of not only Ta and other low-resistance thin metal films, which are measured popularly, but also ITO and other high-resistance thin metal films are detectable with a high sensitivity.

Table 3 below shows that the maximum $\Delta V$ differs from a kind of coil to another when the resonant frequency is changed. In Table 3, the coil characteristics (resonance properties) are obtained by changing the capacitance of each coil, and $\Delta V$ is obtained for each resonance property, as shown in FIG. 18 and FIG. 19. It is desirable to use a coil that presents a maximum $\Delta V$ at the drive frequency actually used.

TABLE 3

| Capacitor | 15pF | | 33pF | | 220pF | |
|---|---|---|---|---|---|---|
| | $\Delta V(v)$ | f(kHz) | $\Delta V(v)$ | f(kHz) | $\Delta V(v)$ | f(kHz) |
| Coil A | 0.134 | 920 | 0.129 | 780 | 0.018 | 410 |
| Coil B | 0.182 | 900 | 0.166 | 690 | 0.012 | 380 |
| Coil C | 0.363 | 850 | 0.142 | 580 | 0.009 | 330 |
| Coil D | 0.537 | 810 | 0.116 | 530 | 0.008 | 270 |

A series resonant circuit has been explained in the present embodiment as a resonant circuit used for the evaluation of a coil as well as other purposes. There are, however, alternatives to this: a parallel resonant circuit may be used in which a capacitor C is connected in parallel to a coil.

In the first to third embodiments, the sensor head is electrically connected to the amplifier via a cable constituted by a copper wire and the like. Further, the stray capacitance of the cable connecting the sensor head to the amplifier exists along with the capacitance of a capacitor that is always in a resonant state.

Therefore, if the sensor head is distanced from the amplifier, the cable connecting the sensor head to the amplifier becomes longer, and the stray capacitance of the cable increases. As a result, the capacitance of a capacitor that is always in a resonant state also grows, causing a problem of reduced detection sensitivity in detection of the sheet resistance value.

Further, even if the sensor head is designed employing the value of the capacitor under specified conditions, the stray capacitance of the cable affects negatively; therefore, sensitivity varies depending on the length of the cable, which hinders repeated manufacture of sensor heads having the same level of sensitivity.

Accordingly, in the fourth embodiment below, a sheet resistance meter will be explained that can reduce negative effects of the stray capacitance of the cable and allows sensor heads to be repeatedly manufactured at low cost without reducing the sensitivity in detection of the sheet resistance value.

Embodiment 4

Referring to FIG. 22 to FIG. 26, the following description will discuss another embodiment in accordance with the present invention. In the present embodiment, the resonant circuit of the third embodiment is explained in relation to its application in an eddy-current-type sheet resistance meter. Here, for convenience, members of the present embodiment that have the same arrangement and function as members of the previous embodiments, and that are mentioned in the previous embodiments are indicated by the same reference numerals and description thereof is omitted. Further, the sensor head used here is identical to the sensor head 21 used in the second embodiment.

Figure 22:
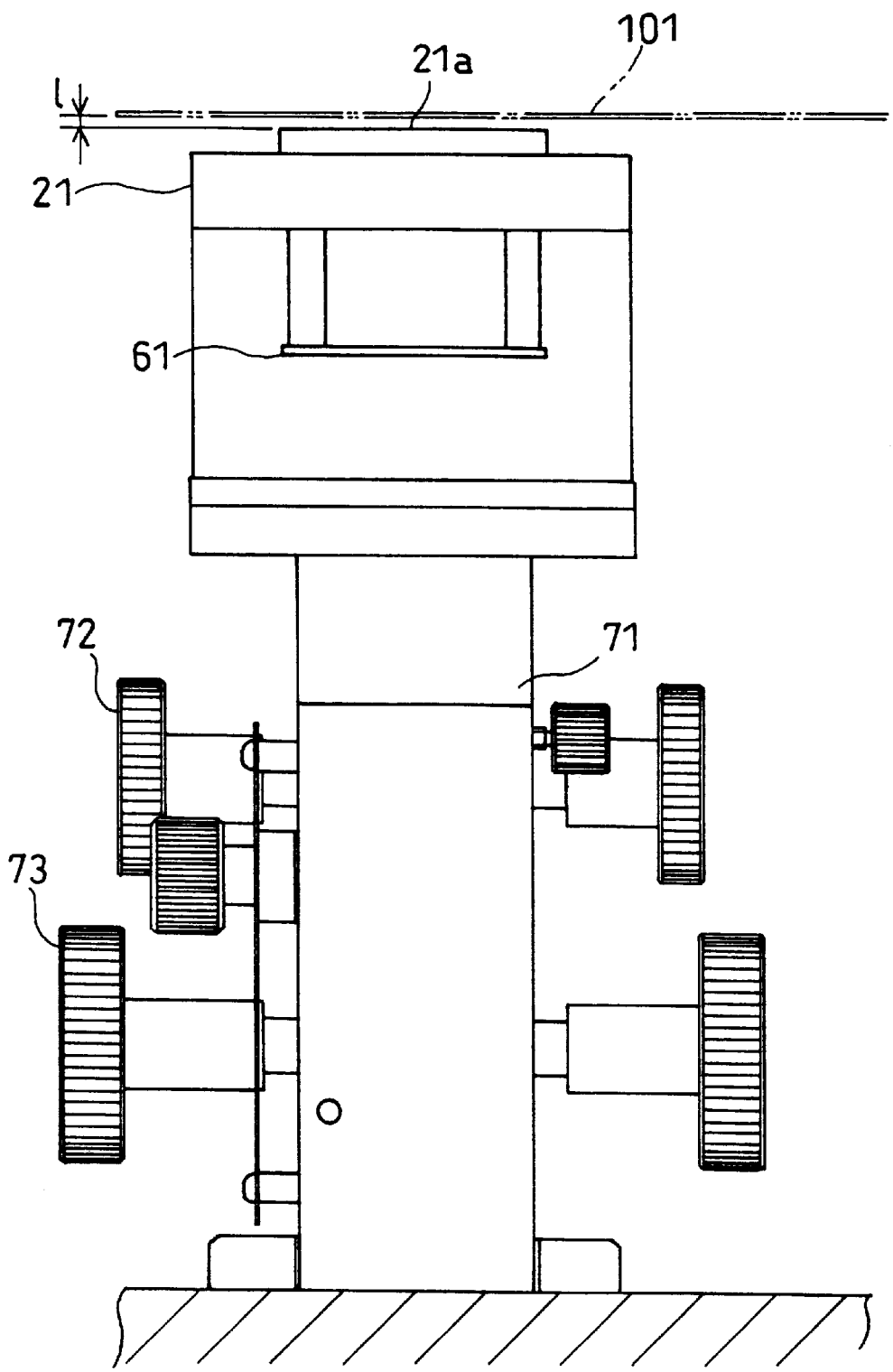
FIG. 22 is an explanatory view showing a sheet resistance meter of a further embodiment in accordance with the present invention installed in a manufacturing line for semiconductor wafers.

An eddy-current-type sheet resistance meter of the present embodiment includes an amplifier circuit 61 in close proximity to the sensor head 21 as shown in FIG. 22.

The sensor head 21 is distanced a predetermined distance l from a semiconductor wafer 101, and is attached to a support base 71 on the side opposite to the side facing the semiconductor wafer 101.

The support base 71 has a Y-axis wheel 72 for moving the sensor head 21 along the Y-axis, a Z-axis wheel 73 for moving the sensor head 21 along the Z-axis, and an X-axis wheel (not shown) for moving the sensor head 21 along the X-axis.

The distance l between the top surface 21a of the sensor head 21 and the semiconductor wafer 101 and the position to detect the sheet resistance are set to a predetermined value and to a predetermined position respectively by the operation of those wheels disposed at the support base 71.

Figure 23:
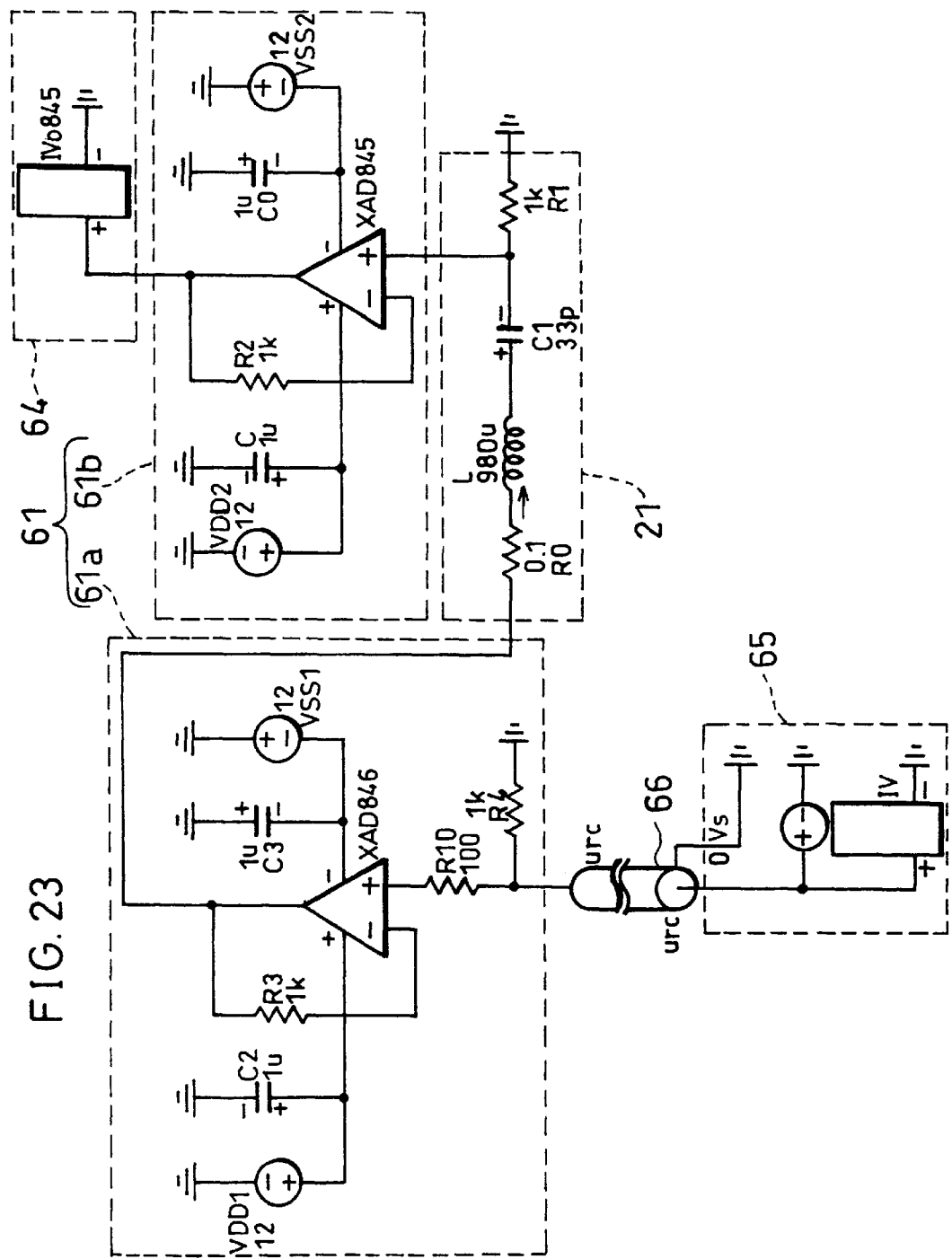
FIG. 23 is a circuit diagram showing the sensor head shown in FIG. 22 together with an additional amplifier circuit.

An amplifier circuit 61 is constituted by an amplification section 61a connected to the signal input end of the sensor head 21 and an amplification section 61b connected to the signal output end of the sensor head 21 as shown in FIG. 23.

The amplification section 61a, being electrically connected via a cable 66 to an amplifier 65 that includes a high frequency power supply source and other components, amplifies in an operational amplifier the high frequency electric power supplied via the cable 66 and provides the amplified electric power to the coil of the sensor head 21.

Meanwhile, the amplification section 61b, being connected at its output to an amplifier 64, amplifies in an operational amplifier the output voltage supplied from the sensor head 21 and provides the amplified voltage to the amplifier 64. An A-to-D converter (not shown) is coupled to the output of the amplifier 64 so as to convert the output voltage from analog to digital.

The amplifier circuit 61 is electrically connected to the sensor head 21 via a cable of a shortest possible length.

Since the amplifier circuit 61 is disposed in close proximity to the sensor head 21 as in the foregoing, the detection of the sheet resistance value of the thin film can be performed stably on the sensor head 21 without being affected by the stray capacitance of the cable 66.

Further, since the sensor head 21 is not affected by the stray capacitance of the cable 66, no limitations need to be imposed on the cable 66. This allows the distance to be freely specified between the sensor head 21 and the amplifier 65 for applying a high frequency electric power to the sensor head 21; hence, more choices are available regarding the sheet resistance meter and the place where the monitor is installed. The sheet resistance meter can be readily incorporated in an existent manufacturing line in-line.

When the sensor head 21 is attached to the support base 71 as in the foregoing, the amplifier circuit 61 can be attached to where it can be attached, for example, on the bottom side of the sensor head 21.

Further, as explained earlier in the second embodiment, if the sensor head 21 is to be incorporated in the robot hand 31 (see FIG. 7), it is desirable to dispose the amplifier circuit 61 on a hand section 31a of the robot hand 31. However, no particular limitations are imposed on where the amplifier circuit 61 is disposed on the hand section 31a: for example, the amplifier circuit 61 may be disposed on the back surface of the hand section 31a of the robot hand 31.

Figure 26:
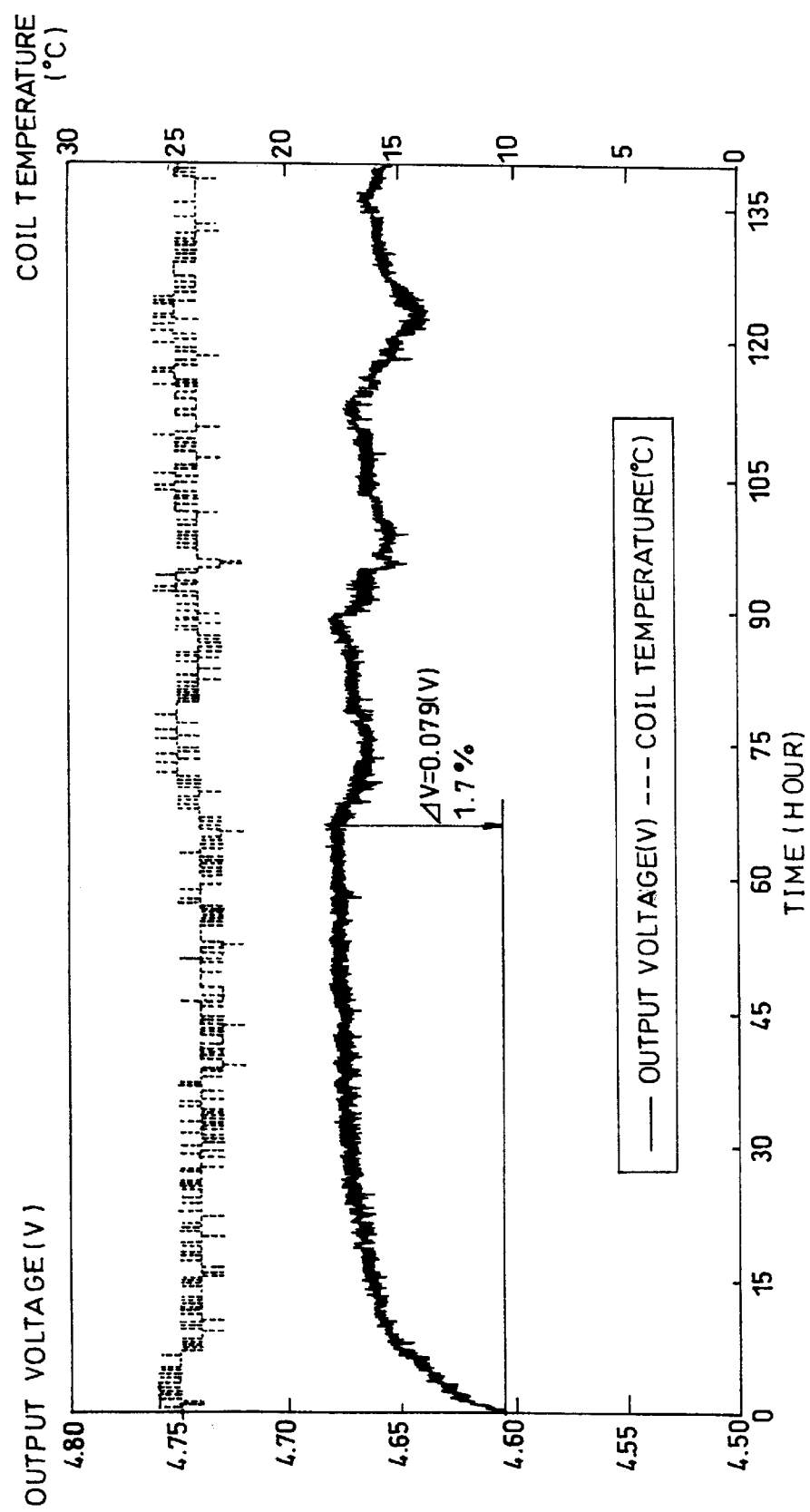
FIG. 26 is a graph showing correlation between voltage drifts and coil temperatures when the sheet resistance is measured on a semiconductor wafer according to initial settings, instead of the process shown in FIG. 24.

Incidentally, typically, if a sheet resistance meter is used in a manufacturing line of semiconductor wafers, coil temperature is likely to change with time, which causes voltage drift and thereby variations in the output voltage from the sensor head. This may eventually lead to imprecise detection of the sheet resistance value. For example, as shown in FIG. 26, the difference ($\Delta V$) between the output voltage immediately after the sheet resistance meter is activated and the output voltage after about 65 hours has elapsed is 0.079V.

Accordingly, it is suggested that the output voltage can be maintained at a constant value by obtaining the output voltage at a predetermined time interval. Specifically, the output voltage is obtained anew for every predetermined number (one lot) of semiconductor substrates that are provided thereon with a thin film and undergo processes in a manufacturing line.

Figure 24:
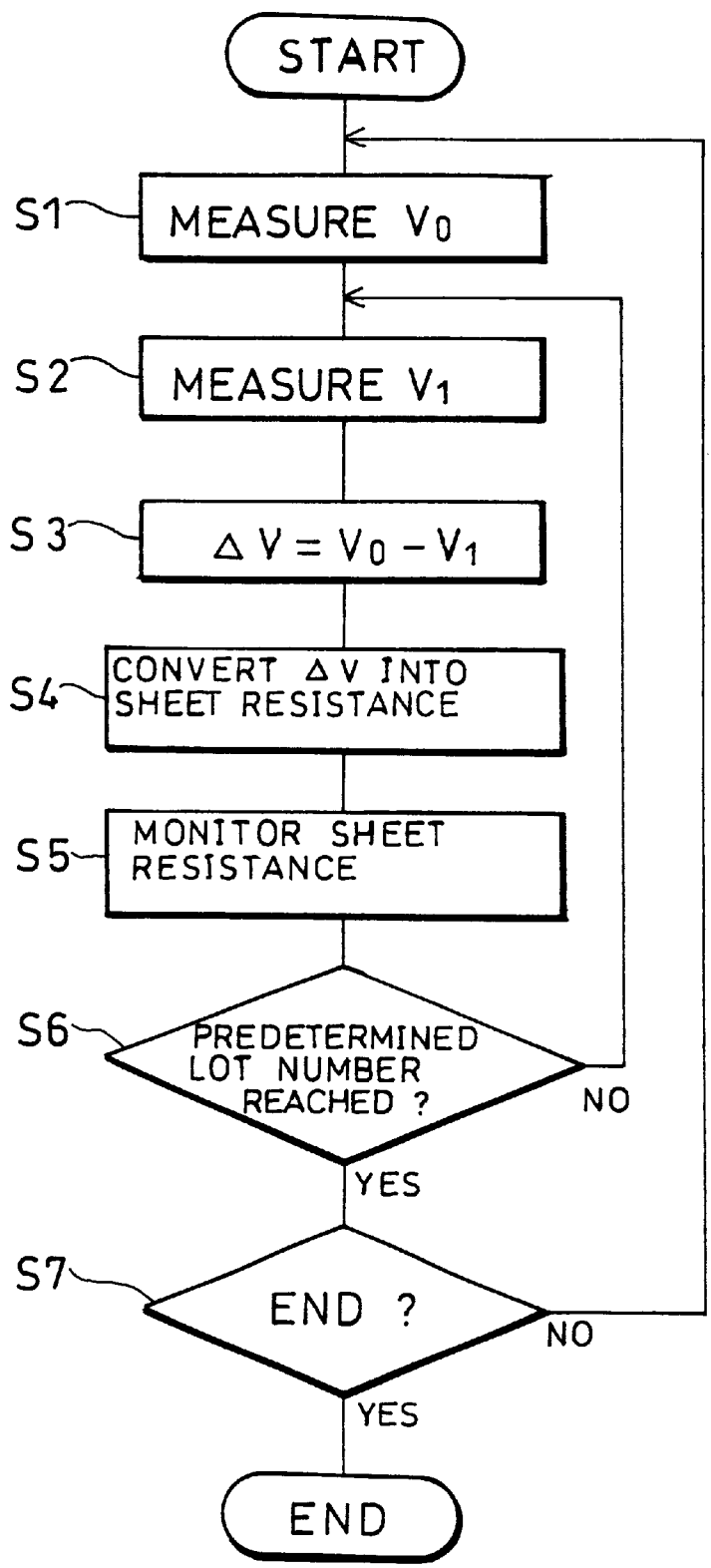
FIG. 24 is a flow chart diagram showing a process of measurement of the sheet resistance on a semiconductor wafer when the sheet resistance meter shown in FIG. 22 is installed in a manufacturing line.

The process will be explained in reference to the flow chart constituting FIG. 24. The capacitors and the resistors constituting the resonant circuit used to carry out the process are extremely precise in temperature characteristic. The capacitors are mica capacitors with a temperature characteristic of 0 ppm/° C. to 70 ppm/° C., and the resistors are metal-foil precision resistors with a resistance temperature characteristic of 0±2.5 ppm/° C. in a range of −55° C. to +125° C.

First, the output voltage V0 is measured (S1) without an object to be measured, i.e., semiconductor wafer, placed in the manufacturing line.

Next, the output voltage V1 is measured (S2) with an object placed in the manufacturing line. Here, the sheet resistance value is measured on each semiconductor wafer in the manufacturing line. In other words, initialization is performed for every lot.

Subsequently, the difference ($\Delta V$) between V0 and V1 is obtained (S3).

Next, $\Delta V$ is translated into the sheet resistance (S4).

Then, the sheet resistance obtained in S4 is monitored (S5).

Next, it is determined whether or not the translation into the sheet resistance has been performed for the predetermined number of lots of semiconductor wafers (S6). Here, one lot includes 20 semiconductor wafers.

If it is determined in S6 that the translation into the sheet resistance has not performed for the predetermined number of lots, the process goes on to S2 to obtain the sheet resistances of the remaining semiconductor wafers.

Meanwhile, if it is determined in S6 that the translation into the sheet resistance has been performed for the predetermined number of lots, it is determined whether or not the detection of the sheet resistance of semiconductor wafers on the manufacturing line will be terminated (S7).

If it is determined in S7 that the detection of the sheet resistance will not be terminated, the process goes to S1 to measure the sheet resistance of semiconductor wafers of a new lot.

Meanwhile, if it is determined in S7 that the detection of the sheet resistance will be terminated, the process is stopped.

Figure 25:
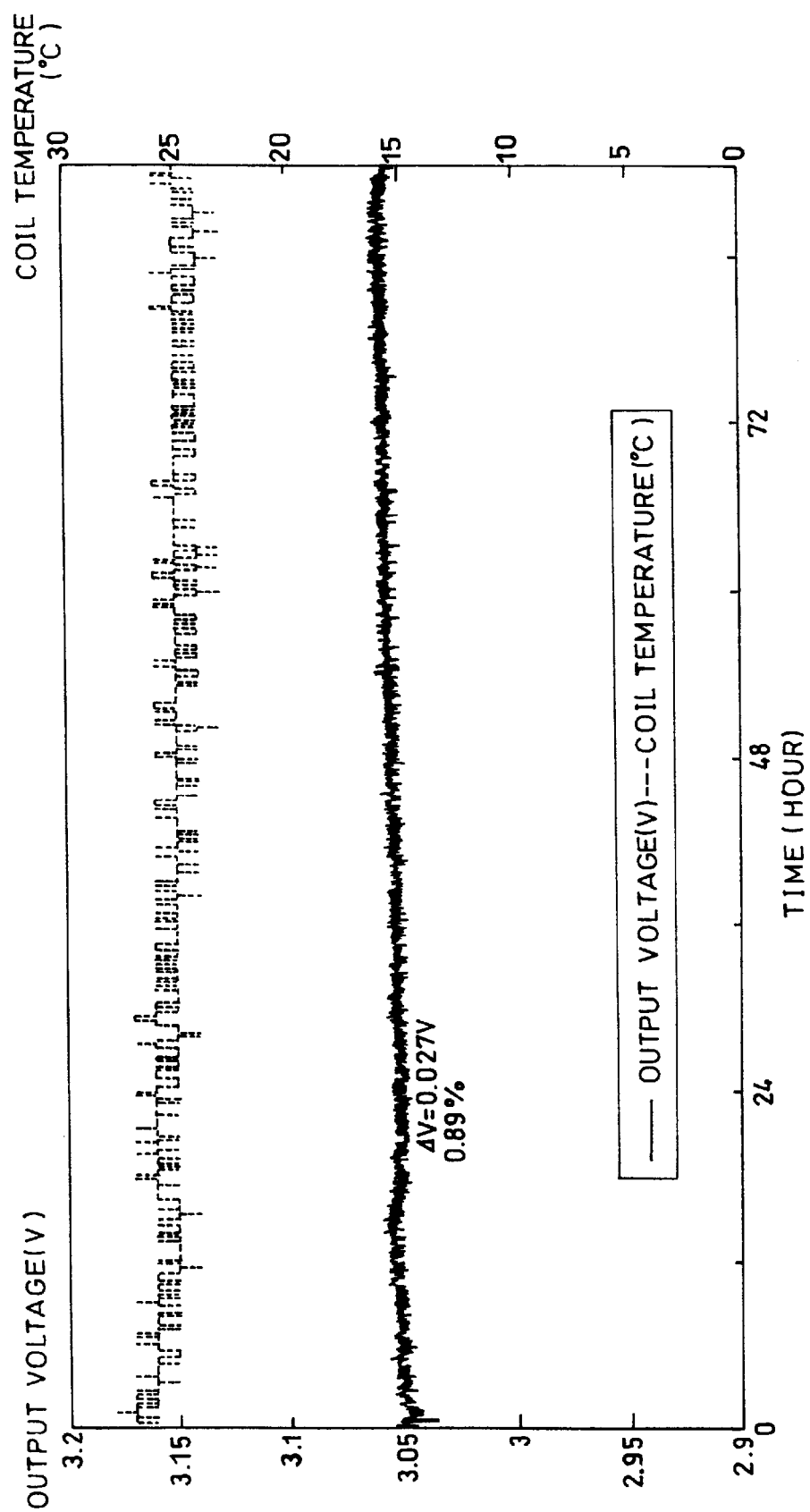
FIG. 25 is a graph showing correlation between voltage drifts and coil temperatures when the sheet resistance is measured on a semiconductor wafer according to the process shown in FIG. 24.

From the process laid out above, for example, as shown in FIG. 25, the difference ($\Delta V$) between the output voltage immediately after the measurement and the output voltage after about 24 hours has elapsed is 0.027V, and the fluctuation rate is 0.89%. The output voltage therefore is not affected by voltage drifts that occur with elapsing time and remains at a constant value.

In other words, we now know that the voltage drifts can be reduced in the resonant circuit by the inclusion of the capacitors and resistors in the resonant circuit that are fabricated in material with an extremely precise temperature characteristic as mentioned earlier.

Initialization is preformed for every lot in the foregoing process. Alternatively, initialization may be performed, for example, at a predetermined time interval and is still useful. In such an event, if an object is present when initialization is performed after a predetermined period of time has elapsed, the initialization is skipped temporarily and will be performed after another predetermined period of time has elapsed.

From the foregoing, according to the first to fourth embodiment, the use of the sheet resistance meter in accordance with the present invention greatly improves operational efficiency in the manufacture of semiconductor wafers 101. Further, when it is determined that the semiconductor wafer 101 is defective, i.e., the thin-film metal 15 formed on the semiconductor wafer 101 is defective, the problem can be solved immediately.

This will improve the yield and throughput of the semiconductor wafer 101. Further, a person in charge can monitor for an abrupt abnormality and time-dependent variations in thin film fabrication on the monitor 4a of the controller 4, and can easily understand the conditions of semiconductor wafers 101 in the manufacturing line.

Accordingly, the sheet resistance can be measured without scratching or damaging the thin-film metal 15 formed on the semiconductor wafer 101, the film properties can be managed easily in-line with a wide range of films from Ta and other low-resistance films to ITO and other high-resistance film, and as a result, the test can be performed not only on some selected semiconductor wafers 101 but also on all the semiconductor wafers 101.

This enables the establishment of a highly precise in-line test system to be built for the semiconductor wafer 101, and thus allows immediate actions to be taken as to the defect of the semiconductor wafer 101 that occurs in the manufacturing line. As a result, the semiconductor wafers manufactured have thin-film metals with consistent properties.

As detailed in the foregoing, a first sheet resistance meter in accordance with the present invention is a sheet resistance meter for measuring a sheet resistance of a thin film formed on a substrate, and is characterized in that it includes:

a sensor head for generating a magnetic field; and sheet resistance detection means for, when the substrate is placed at a predetermined distance from the sensor head, detecting a variation in the magnetic field generated by the sensor head as the sheet resistance of the thin film formed on the substrate, wherein the sensor head is disposed opposing only one of two sides of the substrate.

With the arrangement, the sensor head is disposed opposing only one of two sides of the substrate; therefore, the sheet resistance of the thin film formed on the substrate can be measured on either the top side or the bottom side, while, for example, the substrate, i.e., an object to be measured, is in the manufacturing line.

This enables the sheet resistance of the thin film formed on the substrate to be measured in a manufacturing line, and thereby, unlike conventional technology, eliminate the need to remove the substrate from the manufacturing line to measure the sheet resistance. Accordingly, the sensor head can be incorporated into an existent manufacturing process or manufacturing machine, facilitating its in-line integration.

Further, the sensor head and the substrate are placed at a predetermined distance from each other when the sheet resistance of the thin film on the substrate is measured; therefore, the sensor head can measure the sheet resistance of the thin film without contacting the thin film on the substrate.

As a result, the sheet resistance of the thin film can be measured without the sensor head scratching or damaging the substrate or the thin film formed on the substrate.

A second sheet resistance meter in accordance with the present invention includes all the features of the first sheet resistance meter, and is further characterized in that the sensor head is constituted by a coil of a conducting wire wound in turns around a magnetic material such as ferrite.

The arrangement has the same advantages as the first sheet resistance meter. In addition, since the sensor head is constituted by a coil wound in turns around a magnetic material such as ferrite, the magnetic flux generated by the sensor head is concentrated along the co-axis with high efficiency. As a result, the sheet resistance detection sensitivity is improved.

Further, by properly designing the ferrite and the coil, the sensor head can be reduced in thickness without degrading the sensitivity of the sensor.

Accordingly, if the sensor is reduced in thickness as in the foregoing, more versatile design is available for the process and machine for the manufacture of the substrate: for example, the sensor may be embedded in a robot hand that is a device for removing defective substrates from the manufacturing line. If the sensor head is embedded in the robot hand in this manner, the sheet resistance of the substrate transported along the manufacturing line can be measured provided that the robot hand is placed under the manufacturing line. When this is the case, the substrate can be immediately removed upon a determination that the sheet resistance is defective.

A third sheet resistance meter in accordance with the present invention includes all the features of the second sheet resistance meter, and is further characterized in that the magnetic material is disposed so as not to contact the coil.

Typically, if the coil which is in contact with the magnetic material, as an a.c. current is passed through the coil upon the generation of the magnetic field, eddy currents are induced not only in the coil but also in the magnetic material. Those eddy currents induced in the magnetic material generate Joule heat and thereby cause an eddy current loss, affecting the eddy current loss that occurs in the coil. In other words, the eddy current loss in the sensor head is the sum of the eddy current loss in the coil and the eddy current loss in the magnetic material, which hinders precise measurement of the sheet resistance of the thin film.

Accordingly, even if an a.c. current is passed through the coil upon the generation of the magnetic field, the eddy currents flowing through the magnetic material can be reduced greatly by disposing the coil so as not to contact the magnetic material as in the foregoing arrangement. This reduces the negative effect of the eddy current loss in the magnetic material on the eddy current loss in the coil, and thereby enables precise detection of the sheet resistance based on the eddy current loss in the sensor head.

A fourth sheet resistance meter in accordance with the present invention includes all the features of the first sheet resistance meter, and is further characterized in that the sensor head is constituted only by a coil including a conducting wire wound in turns.

The arrangement has the same advantages as the first sheet resistance meter. In addition, since the sensor head is constituted only by a coil, the sensor head is less affected by temperature, and is capable of detecting a variation in the magnetic field in a more stable manner than a coil with a ferrite core.

In order to improve the sensitivity of the sensor head, a fifth sheet resistance meter in accordance with the present invention includes all the features of either one of the second to fourth sheet resistance meters, and is further characterized in that the conducting wire is a Litzendraht wire.

The arrangement has the same advantages as either one of the second to fourth sheet resistance meter in accordance with the present invention. In addition, since the conducting wire constituting the coil is a Litzendraht wire, the coil has a reduced a.c. resistance and thus a reduced skin effect in high frequencies, improving the sensitivity of the coil.

A sixth sheet resistance meter in accordance with the present invention includes all the features of the first to fifth sheet resistance meter, and is further characterized in that the sheet resistance detection means includes a resonant circuit constituted by a capacitor and a coil constituting the sensor head, wherein the resonant circuit is always maintained in a resonant state by the supply of an a.c. voltage to the coil, when the thin film is brought within a predetermined distance from the coil, the sheet resistance detection means detects an eddy current loss, which is a change in characteristics of the coil, caused in the thin film by the magnetic field generated by the coil, and detects the eddy current loss as a variation in the magnetic field.

The arrangement has the same advantages as either one of the first to fifth sheet resistance meter. In addition, since the sheet resistance detection means is arranged so as to detect an eddy current loss, which is a change in characteristics of the coil, caused in the thin film by the magnetic field generated by the coil, and to detect the eddy current loss as a variation in the magnetic field, the sheet resistance can be detected relatively easily compared to direct detection of the magnetic field.

Since, only a change in the current needs to be measured in the resonant circuit, the sheet resistance of the thin film can be detected relatively easily compared to direct measurement of the sheet resistance.

Further, the eddy current loss is also caused by a minimal change in the magnetic field, the sensitivity in detecting the sheet resistance can be improved.

Accordingly, the sheet resistance of ITO and other high-resistance thin films can be measured precisely.

A seventh sheet resistance meter in accordance with the present invention includes all the features of the sixth sheet resistance meter, and is further characterized in that the sheet resistance detection means includes a series resonant circuit in which the coil is connected in series with a capacitor.

An eighth sheet resistance meter in accordance with the present invention includes all the features of the seventh sheet resistance meter, and is further characterized in that the capacitor has a variable capacitance.

With the arrangement, the capacitor in the series resonant circuit has a variable capacitance; therefore, the difference in a.c. voltage applied across the coil may be varied in its absolute value. In other words, the sensitivity of the sheet resistance meter in detecting the sheet resistance can be adjusted by varying the capacitance of the capacitor.

With the capacitor having a variable capacitance in this manner, the sensitivity of the sheet resistance meter in detecting the sheet resistance can be readily adjusted according to a target object.

Accordingly, even if the coil in the sheet resistance meter is replaced, the sheet resistance can be detected always with a maximum sensitivity according to properties of the coil.

A ninth sheet resistance meter in accordance with the present invention includes all the features of the seventh or eighth sheet resistance meter, and is further characterized in that the sheet resistance detection means detects a variation in an a.c. voltage applied across a resistor connected in series to the coil as a current dissipation caused by an eddy current.

The arrangement has the same advantages as either one of the seventh or eighth sheet resistance meter. In addition, the sheet resistance detection means detects a variation in an a.c. voltage applied across a resistor connected in series to the coil as a current dissipation caused by an eddy current, and translates the current dissipation caused by an eddy current to an a.c. voltage variation; thereby, a minimal variation in eddy currents can be translated into a large variation in a.c. voltage. This enables the detection of the sheet resistance to be performed with good sensitivity on a high-resistance thin film, etc. in which current varies only in small quantities.

As a result, the variation in the a.c. voltage applied across the resistor can be easily adjustable by changing the value of the resistance.

Accordingly, since a minimal eddy current loss can be translated into a large variation in the a.c. voltage applied across the resistor, the detection of the sheet resistance can be performed precisely on a high-resistance thin film, etc. in which only a relatively small eddy current loss is occurs.

Further, high frequency a.c. ammeters are costly and hardly available in the market. Translating a variation in the current flowing through the circuit into a variation in the voltage ($V=R \times I$) applied across the resistor $R(=1k)$ connected in series as mentioned earlier eliminates the need to use the costly, hardly available high frequency a.c. ammeter, and allows the use of a relatively cheap voltmeter instead.

A tenth sheet resistance meter in accordance with the present invention includes all the features of the ninth sheet resistance meter, and is further characterized in that the sheet resistance detection means translates the detected a.c. voltage variation into an equivalent d.c. voltage variation.

The arrangement has the same advantages as the ninth sheet resistance meter. In addition, since the sheet resistance detection means translates the detected a.c. voltage variation into an equivalent d.c. voltage variation, the detected a.c. voltage variation can be read on a relatively cheap, and popularly available digital voltmeter. The sheet resistance meter can be hence manufactured at low cost.

An eleventh sheet resistance meter in accordance with the present invention includes all the features of the ninth or tenth sheet resistance meter, and is further characterized in that the sheet resistance detection means detects the sheet resistance according to either the a.c. voltage variation or the d.c. voltage variation at frequencies approximately equal to the resonant frequency of the coil.

The arrangement has the same advantages as either one of the ninth and tenth sheet resistance meters. In addition, the sheet resistance detection means detects the sheet resistance according to either the a.c. voltage variation or the d.c. voltage variation (hereinafter, will be referred to simply as a voltage variation) at frequencies approximately equal to the resonant frequency of the coil. The sheet resistance can be measured easily from the voltage variation by referring to a sheet-resistance-value-correction straight line that is prepared in advance.

Further, if the voltage variation grows, the contribution to the voltage variation by the sheet resistance also grows, which enables precise detection of the sheet resistance.

A twelfth sheet resistance meter in accordance with the present invention includes all the features of the eleventh sheet resistance meter, and is further characterized in that the sheet resistance detection means specifies either a frequency at which the a.c. voltage variation is maximum or a frequency at which the d.c. voltage variation is maximum as a drive frequency of the coil.

The arrangement has the same advantages as the eleventh sheet resistance meter. In addition, the sheet resistance detection means specifies either a frequency at which the a.c. voltage variation is maximum or a frequency at which the d.c. voltage variation is maximum as a drive frequency of the coil; thereby the sheet resistance detection means detects the sheet resistance with improved precision. Further, the voltage variation is maximum a few % off the resonant frequency. Preferably, the maximum value here is designated as the drive frequency for the coil.

If a sheet resistance meter containing a coil whose drive frequency is specified in foregoing manner is used, the sheet resistance of the thin film becomes detectable with good sensitivity; thus, the sheet resistance of ITO and other high-resistance thin films becomes detectable A thirteenth sheet resistance meter in accordance with the present invention includes all the features of either one of the sixth to twelfth sheet resistance meters, and is further characterized in that the sheet resistance detection means calculates either a difference between an a.c. voltage value when the thin film is not in a sheet resistance measurement position with respect to the coil and an a.c. voltage value when the thin film is in the sheet resistance measurement position with respect to the coil or a difference between a d.c. voltage value when the thin film is not in a sheet resistance measurement position with respect to the coil and a d.c. voltage value when the thin film is in the sheet resistance measurement position with respect to the coil, and detects an eddy current loss in the thin film based on either the difference between the a.c. voltage values or the difference between the d.c. voltage values.

The arrangement has the same advantages as either one of the sixth to twelfth sheet resistance meters. In addition, the sheet resistance detection means calculates a difference between either an a.c. voltage value or a d.c. voltage value when the thin film is not in a sheet resistance measurement position with respect to the coil and either an a.c. voltage value or a d.c. voltage value when the thin film is in the sheet resistance measurement position with respect to the coil, and detects an eddy current loss in the thin film based on the difference between either the a.c. voltage values or the d.c. voltage values; therefore, the detection is not affected by the drift of voltage that occurs when the thin film is not in the sheet resistance measurement position with respect to the coil.

If the calculation of the difference between either the a.c. voltage values or the d.c. voltage values is executed at a timing, for example, as defined in the description below referring to a fourteenth or fifteenth sheet resistance meter, the sheet resistance can be measured stably over a long period of time.

The fourteenth sheet resistance meter in accordance with the present invention includes all the features of the thirteenth sheet resistance meter, and is further characterized in that the sheet resistance detection means measures either the a.c. voltage value or the d.c. voltage value when the thin film is not in the sheet resistance measurement position at a predetermined time interval.

The fifteenth sheet resistance meter in accordance with the present invention includes all the features of the thirteenth sheet resistance meter, and is further characterized in that the sheet resistance detection means measures either the a.c. voltage value or the d.c. voltage value when the thin film is not in the sheet resistance measurement position every time the measurement of the sheet resistance is performed on a predetermined number of thin films.

A sixteenth sheet resistance meter in accordance with the present invention includes all the features of either one of the six to fifteenth sheet resistance meters, and is further characterized in that the coil is adjusted, through a change in a capacitance of the capacitor, so as to be driven at such a frequency that the coil shows a maximum sensitivity in detecting the sheet resistance.

The arrangement has the same advantages as either one of the sixth to fifteenth sheet resistance meter. In addition, the coil can be driven at an optimal drive frequency; therefore, for example, even if the properties of the coil vary from one coil to another, the sensitivity of the coil in detecting the sheet resistance can always be adjusted to a maximum level by varying the capacitance of the capacitor. As a result, the sheet resistance of the thin film can be always measured with good sensitivity.

A seventeenth sheet resistance meter in accordance with the present invention includes all the features of either one of the sixth to sixteenth sheet resistance meters, and is further characterized in that the capacitor and the resistor included in the resonant circuit are fabricated in a material that imparts an extremely precise temperature characteristic.

The arrangement has the same advantages as the sixth to sixteenth sheet resistance meters. In addition, the capacitor and the resistor included in the resonant circuit are fabricated in a material that imparts an extremely precise temperature characteristic; therefore, the drift of the voltage can be reduced in the resonant circuit.

An eighteenth sheet resistance meter in accordance with the present invention includes all the features of either one of the first to seventeenth sheet resistance meters, and is further characterized in that an amplifier circuit for amplifying an input signal to the sensor head is disposed in close proximity to the sensor head.

The arrangement has the same advantages as the first to seventeenth sheet resistance meter in accordance with the present invention. In addition, an amplifier circuit is disposed in close proximity to the sensor head; therefore, the sensor head can stably detect the sheet resistance value of the thin film without being affected by the stray capacitance of the cable connecting the sensor head to the sheet resistance detection means.

Further, since the sensor head is not affected by the stray capacitance of the cable, no limitations are imposed on the length of the cable. This allows the distance between the sensor head and the amplifier constituting the sheet resistance detection means for applying a high frequency electric power to the sensor head to be freely determined, and thereby renders the sheet resistance meter more versatile and easier to incorporate in the existent manufacturing line.

A nineteenth sheet resistance meter in accordance with the present invention includes all the features of either one of the first to eighteenth sheet resistance meters, and is further characterized in that an amplifier circuit for amplifying an output signal from the sensor head is disposed in close proximity to the sensor head.

The arrangement has the same advantages as the first to eighteenth sheet resistance meters. In addition, an amplifier circuit for amplifying an output signal from the sensor head is disposed in close proximity to the sensor head; therefore, before a signal detected by the sensor head can be amplified before being contaminated with noise. This enables the signal detected by the sensor head to be supplied to the sheet resistance detection means or a like receiving component without being affected by noise.

As with the advantages of the eighteenth sheet resistance meter, the sensor head here is not affected by the stray capacitance of the cable; therefore, no limitations are imposed on the length of the cable. This allows the distance between the sensor head and the amplifier constituting the sheet resistance detection means for applying a high frequency electric power to the sensor head to be freely determined, and thereby renders the sheet resistance meter more versatile and easier to incorporate into the existent manufacturing line.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A sheet resistance meter of a non-contacting type for measuring a sheet resistance of a thin film formed on a substrate, comprising:

a high frequency generation circuit;

a sensor head including a coil, connected at an end thereof to the high-frequency generating circuit, for generating a magnetic field;

sheet resistance detection means for detecting the sheet resistance of the thin film formed on the substrate on the basis of an eddy current loss, the sheet resistance detection means including eddy current loss detection means, connected to another end of the coil, for, when the substrate is placed at a predetermined distance from the sensor head, detecting an eddy current loss in the thin film due to the magnetic field generated by the coil; and wherein the sensor head is disposed opposing only one of two sides of the substrate in such a manner that both the sensor head and the sheet resistance detector means do not contact the substrate.

2. The sheet resistance meter as set forth in claim 1, wherein the coil is constituted by a conducting wire wound in turns around a magnetic material.

3. The sheet resistance meter as set forth in claim 2, wherein the magnetic material is disposed so as not to contact the coil.

4. The sheet resistance meter as set forth in claim 2, wherein the conducting wire is a Litzendraht wire.

5. The sheet resistance meter as set forth in claim 2, wherein the magnetic material is ferrite.

6. The sheet resistance meter as set forth in claim 1, wherein the eddy current loss detection means includes a detector circuit for obtaining the eddy current loss by for separating a necessary signal wave from a modulated wave from the other end of the coil.

7. The sheet resistance meter as set forth in claim 1, wherein the coils is constituted only by a conducting wire wound in turns.

8. The sheet resistance meter as set forth in claim 1, wherein the eddy current loss detection means includes a capacitor constituting a resonant circuit with the coil in the sensor head, always maintains the resonant circuit in a resonant state by means of the high frequency current supplied to the coil, and detects the eddy current loss when the thin film is brought within a predetermined distance of the coil.

9. The sheet resistance meter as set forth in claim 8, wherein the resonant circuit includes a series resonant circuit in which the coil is connected in series with the capacitor.

10. The sheet resistance meter as set forth in claim 9, wherein the capacitor has a variable capacitance.

11. The sheet resistance meter as set forth in claim 9, wherein the series resonant circuit detects a variation in an a.c. voltage applied across a resistor connected in series with the coil as the eddy current loss.

12. The sheet resistance meter as set forth in claim 11, wherein the sheet resistance detection means translates the detected a.c. voltage variation into an equivalent d.c. voltage variation.

13. The sheet resistance meter as set forth in claim 11, wherein the sheet resistance detection means detects the sheet resistance according to either the a.c. voltage variation or the d.c. voltage variation at frequencies approximately equal to the resonant frequency of the coil.

14. The sheet resistance meter as set forth in claim 13, wherein the high frequency generation circuit specifies either a frequency at which the a.c. voltage variation is maximum or a frequency at which the d.c. voltage variation is maximum as a drive frequency of the coil.

15. A sheet resistance meter of a non-contacting type for measuring a sheet resistance of a thin film formed on a substrate, comprising:

a sensor head for generating a magnetic field;

sheet resistance detection means for, when the substrate is placed at a predetermined distance from the sensor head, detecting a variation in the magnetic field generated by the sensor head as the sheet resistance of the thin film formed on the substrate;

wherein the sensor head is disposed opposing only one of two sides of the substrate, in such a manner that both the sensor head and the sheet resistance detector means do not contact the substrate;

wherein the sheet resistance detection means includes a resonant circuit constituted by a capacitor and a coil constituting the sensor head, where the resonant circuit is always maintained in a resonant state by the supply of an a.c. voltage to the coil, and when the thin film is brought within a predetermined distance from the coil, the sheet resistance detection means detects an eddy current loss, which is a change in characteristics of the coil, caused in the thin film by the magnetic field generated by the coil, and detects the eddy current loss as a variation in the magnetic field; and wherein the sheet resistance detection means calculates either a difference between an a.c. voltage value when the thin film is not in a sheet resistance measurement position with respect to the coil and an a.c. voltage value when the thin film is in the sheet resistance measurement position with respect to the coil or a difference between a d.c. voltage value when the thin film is not in a sheet resistance measurement position with respect to the coil and a d.c. voltage value when the thin film is in the sheet resistance measurement position with respect to the coil, and detects an eddy current loss in the thin film based on either the difference between the a.c. voltage values or the difference between the d.c. voltage values.

16. The sheet resistance meter as set forth in claim 15, wherein the sheet resistance detection means measures either the a.c. voltage value or the d.c. voltage value when the thin film is not in the sheet resistance measurement position at a predetermined time interval.

17. The sheet resistance meter as set forth in claim 15, wherein the sheet resistance detection means measures either the a.c. voltage value or the d.c. voltage value when the thin film is not in the sheet resistance measurement position every time the measurement of the sheet resistance is performed on a predetermined number of thin films.

18. The sheet resistance meter as set forth in claim 8, wherein the coil is adjusted, through a change in a capacitance of the capacitor, so as to be driven at such a frequency that the coil shows a maximum sensitivity in detecting the sheet resistance.

19. The sheet resistance meter as set forth in claim 8, wherein the resonant circuit further includes a resistor, and the capacitor and the resistor included in the resonant circuit are fabricated in a material that imparts an extremely precise temperature characteristic.

20. The sheet resistance meter as set forth in claim 19, wherein the capacitor is a mica capacitor with a temperature characteristic of 0 ppm/° C. to 70 ppm/° C.

21. The sheet resistance meter as set forth in claim 19, wherein the resistor is a metal-foil precision resistors with a resistance temperature characteristic of 0±2.5 ppm/° C. in a range of −55° C. to +125° C.

22. The sheet resistance meter as set forth in claim 1, wherein an amplifier circuit for amplifying an input signal to the sensor head is disposed in close proximity to the sensor head.

23. The sheet resistance meter as set forth in claim 1, wherein an amplifier circuit for amplifying an output signal from the sensor head is disposed in close proximity to the sensor head.

24. A sheet resistance meter for measuring a sheet resistance of a thin film formed on a semiconductor wafer during a course of manufacture, comprising:

a sensor head for generating a magnetic field, the sensor head being disposed on a surface of a robot hand which attracts one of two faces of the semiconductor wafer so as to transport the semiconductor wafer;

sheet resistance detection means for, when the semiconductor wafer is attracted to the robot hand, detecting a variation in the magnetic field generated by the sensor head as the sheet resistance of the thin film formed on the semiconductor wafer; and wherein the sensor head is disposed so that when the semiconductor wafer is attracted to the robot hand, the sensor head does not contact the semiconductor wafer and is separated by a predetermined distance.

25. The sheet resistance meter as set forth in claim 24, wherein the sensor head is disposed close to an attractive pad which keeps the semiconductor wafer attracted to the robot hand.

\* \* \* \* \*